United States Patent [19]

Matsumoto et al.

[11] Patent Number: 5,321,502
[45] Date of Patent: Jun. 14, 1994

[54] MEASURING METHOD AND MEASURING APPARATUS

[75] Inventors: Takahiro Matsumoto, Atsugi; Minoru Yoshii, Tokyo; Kenji Saito, Yokohama; Hiroyasu Nose, Zama; Koichi Sentoku; Seiji Takeuchi, both of Atsugi, all of Japan

[73] Assignee: Canon Kabushiki Kaisha, Tokyo, Japan

[21] Appl. No.: 910,457

[22] Filed: Jul. 8, 1992

[30] Foreign Application Priority Data

Jul. 11, 1991 [JP] Japan .................. 3-171285
Jan. 31, 1992 [JP] Japan .................. 4-016519

[51] Int. Cl.$^5$ ........................... G01B 9/02
[52] U.S. Cl. ..................... 356/349; 356/351
[58] Field of Search ........... 356/349, 351, 356, 357, 356/358, 363; 250/237 G

[56] References Cited

U.S. PATENT DOCUMENTS

| | | | |
|---|---|---|---|
| Re. 34,010 | 7/1992 | Magome et al. | 356/356 X |
| 4,486,657 | 12/1984 | Bush | 356/349 X |
| 4,575,247 | 3/1986 | Tansey | 356/349 |
| 4,650,330 | 3/1987 | Fujita | 356/359 X |
| 4,842,408 | 6/1989 | Yoshii et al. | 356/349 |
| 4,907,886 | 3/1990 | Dandliker | 356/349 |
| 4,948,251 | 8/1990 | Kondo | 356/349 |
| 5,025,168 | 6/1991 | Aoki et al. | 356/401 X |
| 5,076,693 | 12/1991 | Teramoto | 356/349 |
| 5,177,633 | 1/1993 | Wong | 356/349 X |

FOREIGN PATENT DOCUMENTS

| | | |
|---|---|---|
| 58-191907 | 11/1983 | Japan . |
| 2297005 | 7/1990 | Japan . |
| WO8808519 | 11/1988 | PCT Int'l Appl. . |

Primary Examiner—Robert J. Warden
Assistant Examiner—Robert Carpenter
Attorney, Agent, or Firm—Fitzpatrick, Cella, Harper & Scinto

[57] ABSTRACT

A measuring arrangement includes forming first and second pairs of light beams each having a low frequency light beam and a high frequency light beam. Both pairs of light beams generate beat signals of the same frequency. The low frequency light beam of either pair and the high frequency of the other pair pass through a predetermined optical path to cause phase changes in the same direction. Beat signals are generated by superposing the first and second beam pair to provide measurement information on the phase changes.

9 Claims, 18 Drawing Sheets

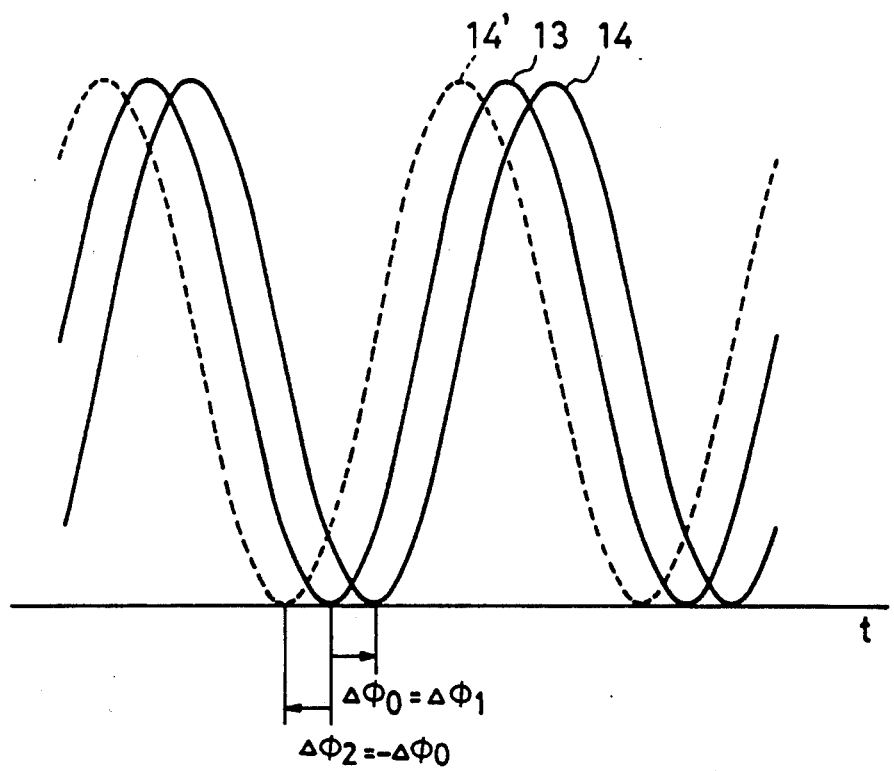

MEASURING METHOD AND MEASURING APPARATUS

BACKGROUND OF THE INVENTION

1. Field of the Invention

The present invention relates to a measuring method and apparatus and more particularly, the present invention is suitable for use in optical heterodyne interference arrangements, for example, a very small displacement measuring apparatus, an alignment apparatus, a brazing registration evaluation apparatus, a length measuring instrument, or an apparatus which measures a very small displacement of an object by using a diffraction means, such as a diffraction grating.

2. Description of the Related Art

Hitherto, a heterodyne interference method capable of detecting information on the phase of light which is in a linear relationship with displacement by phase detection has been widely used for the high-precision measurement of a very small displacement. In the heterodyne interference method, measurements are performed in such a way that interference fringes which change in relation to time and are formed by two light beams whose frequencies are slightly different from each other are photoelectrically detected, and the phase of the interference fringes is converted into the phase of an electrical signal.

FIG. 1 shows a conventional embodiment, which is a very small displacement measuring apparatus which uses a Zeeman laser 301 for a light source and utilizes linearly polarized light beams 302 and 303 intersecting at right angles with each other, frequencies thereof being slightly different from each other, and which constitutes an interferometer. The light 302 is P polarized light having a frequency $f_1$, the electrical vector of which is light within the diagram. The light 303 is S polarized light having a frequency $f_2$, the electrical vector of which is light perpendicular to the diagram. Complex amplitude displays $E_1$ and $E_2$ of respective lights 302 and 303 emitted from the Zeeman laser 301 can be expressed as follows when their respective initial phases are denoted as $\phi_1$ and $\phi_2$:

$$E_1 = A_0 \exp\{i(w_1 t + \phi_1)\} \quad (1)$$

$$E_2 = B_0 \exp\{i(w_2 t + \phi_1)\} \quad (2)$$

where $A_0$ and $B_0$ are amplitudes, $w_1$ and $w_2$ are angular frequencies, $w_1 = 2\pi f_1$ and $w_2 = 2\pi f_2$. Lights 302 and 303 are each amplitude-divided by a beam splitter 304. Either one of light 302 or 303 becomes reference light 306 or 307, and either one of light 302 or 303 becomes signal light 315 or 316 which enter an interferometer.

At this time, the polarization directions of the reference lights 306 and 307 are aligned by a polarization plate 305 (a polarizer for extracting polarization components which are inclined by 45° in their respective polarization directions) and are detected by a photoelectric detector 317. Complex amplitude displays $E_{1R}$ (the complex amplitude of light 307) and $E_{2R}$ (the complex amplitude of reference light 306) of the reference light beams 307 and 306 at this time are as shown below if $L_S$ and $L_0$ denote respectively an optical path length from the light source 301 to the beam splitter 304 and an optical path length from the beam splitter 304 to the photoelectric detector 317, as shown in FIG. 1, and $A_1$ and $B_1$ denote the respective amplitudes of these displays $E_{1R}$ and $E_{2R}$:

$$E_{1R} = A_1 \exp[i\{(w_1 t + \phi_1 - k_1(L_S + L_0)\}] \quad (3)$$

$$E_{2R} = B_1 \exp[i\{(w_2 t + \phi_2 - k_2(L_S + L_0)\}] \quad (4)$$

where $k_1$ and $k_2$ represent the number of waves. If c denotes a light velocity, the following relations are satisfied:

$$k_1 = \frac{2\pi}{c} f_1, \quad k_2 = \frac{2\pi}{c} f_2$$

The polarization direction of the reference light beams 306 and 307 are aligned by the polarization plate 305 so that light beams 306 and 307 interfere with each other. When this interference light is photoelectrically detected by the photoelectric detector 317, a detection signal $I_R$ is:

$$I_R = A^2_1 + B^2_1 + 2A_1 B_1 \cos\{(w_1 - w_2) t + (\phi_1 - \phi_2) + (k_2 - k_1)(L_S + L_0)\} \quad (5)$$

This detection signal is a beat signal having an angular frequency of $w_1 - w_2$, i.e., a frequency of $f_1 - f_2$, and a phase of $\phi_R = (\phi_1 - \phi_2) + (k_2 - k_1)(L_S + L_0)$. In contrast, light which is transmitted through the beam splitter 304 enters a polarization beam splitter 308. Light beam 315 of S polarization is reflected thereby, is reflected by a mirror 310, and travels again toward the polarization beam splitter 308. At this time, the polarization direction is rotated by $\pi/2$ as a result of the light beam 315 passing two times through a $\lambda/4$ plate 309 disposed in the optical path. Because the light has become light of P polarization, it is transmitted through the beam splitter 308. Light beam 316 of P polarization is transmitted through the polarization beam splitter 308 and is reflected by an object 312 to be measured. The light beam 316 travels again toward the polarization beam splitter 308. In the same manner as described above, the polarization direction is rotated by $\pi/2$ as a result of light beam 316 passing two times through a $\lambda/4$ plate 311 disposed in this optical path. Because the light beam has become light of S polarization, it is reflected by the polarization beam splitter 308. Thereafter, the polarization directions of signal light beam 316 of S polarization and signal light beam 315 of P (5) and (8) is measured by using a lock-in amplifier 319 as a synchronization wave detector.

The difference $\Delta\phi$ between the phases of the beat signals shown in equations (5) and (8) is determined as shown in the following equation:

$$\Delta\phi = (k_2 - k_1)(L_0 - L_1) - 2k_1 \Delta L$$

By rearranging this, it follows that:

$$\Delta L = \frac{1}{2k_1}\{\Delta\phi_0 - (k_2 - k_1)(L_0 - L_1)\} \quad (9)$$

If $\Delta\phi_0$ when $\Delta L = 0$ is measured beforehand, $L_0 - L_1 = \Delta\phi_0/(k_2 - k_1)$. Since $k_1$ and $k_2$ are known, $L_0 - L_1$ can be determined.

Thereafter, if the difference $\Delta\phi$ between the phases of the two beat signals shown in equations (5) and (8) is measured, a displacement $\Delta L$ of an object to be measured can be determined on the basis of equation (9).

However, the resolution of such a heterodyne interference measurement depends upon the resolution of a phase measuring apparatus which measures the phase difference between two beat signals. To increase the measurement resolution, the resolution of a phase measuring apparatus must be increased. However, there is a technical limitation regarding this.

Hitherto, a so-called optical encoder which measures a movement amount or a rotation amount of an object by using an optical scale has been used in the field of mechanical control. A conventional optical encoder has been disclosed in, for example, Japanese Patent Laid-Open No. 58-191907. In this optical encoder, coherent light from a light source is made to enter a diffraction grating which is a reference scale through a mirror or the like. ±N-th-order diffracted light emitted from this diffraction grating is reflected by a corner cube to its original direction and is also made to enter the diffraction grating. Then, two diffracted light beams of ±N-th order are diffracted in the same direction to interfere with each other. The intensity of the resulting interference light is detected by an optical sensor.

Since such an apparatus is small and can achieve a high resolution, it has been used for various purposes and for a variety of applications.

As machining and control have become more precise and fine, it has been required that such a measuring apparatus have a higher resolution than ever before.

SUMMARY OF THE INVENTION

The present invention solves the above-mentioned problems in the above-described conventional heterodyne interference measurement.

An object of the present invention is to provide a measuring method and a measuring apparatus capable of obtaining measurement accuracy twice that attained by the prior art even if the resolution of the phase measuring apparatus is constant.

Another object of the present invention is to provide a measuring apparatus which achieves a higher resolution than before in the field of optical encoders in the optical displacement information detection.

The invention is directed to a measuring arrangement in which first and second pairs of light beams each having light beams of different frequencies are formed. A low frequency light beam of the first pair and a high frequency light beam of the second pair pass through a predetermined optical path so that the phases thereof are changed. A first beat signal is formed using the low frequency light beam of the first beam pair from the predetermined optical path and a second beat signal is formed using the high frequency light beam of the second beam pair from the predetermined optical path. The phase change information is measured by comparing the first and second beat signals.

The method of preferred embodiments of the present invention which achieves the above-described objects includes the steps of: forming a first pair of beams having different frequencies and a second pair of beams having different frequencies, both pair of beams generating beat signals having the same frequency; causing a light beam of one of the pair of beams having a low frequency and a light polarization are aligned by a polarization plate 314 similar to the polarization plate 305 and detected by a photoelectric detector 318. If $A_2$ and $B_2$ denote their respective amplitudes, $L_1$ denotes the optical path length of the light flux 315 from the beam splitter 304 to the photoelectric detector 318 after it is reflected by a mirror 310, $L_1+2\Delta L$ denotes the optical path length of the light flux 316 from the beam splitter 304 to the photoelectric detector 318 after it is reflected by the object 312 to be measured, complex amplitude displays $E_{1s}$ and $E_{2s}$ of respective light beams 316 and 315 in the photoelectric detector 318 can be expressed as follows:

$$E_{1s}=A_2 \cdot exp\ [i\ \{(w_1 t+\phi_1-k_1(L_S+L_1+2\Delta L)\}] \qquad (6)$$

$$E_{2s}=B_2 \cdot exp\ [i\ \{(w_2 t+\phi_2-k_2(L_S+L_1)\}] \qquad (7)$$

The polarization directions of the signal light beam 315 and 316 are aligned by the polarization plate 314 to interfere with each other. A detection signal $I_S$ when the resulting interference light is detected by the photoelectric detector 318 is:

$$I_s=A^2_2+B^2_2+2A_2B_2 \cos\ \{(w_1-w_2)\ t+(\phi_1 \phi_2)+(k_2-k_1)\ (L_S+L_1)-2k_1\Delta L\} \qquad (8)$$

This detection signal is a beat signal having a frequency of $w_1-w_2$, i.e., a frequency of $f_1-f_2$, and a phase of $\phi_S=(\phi_1-\phi_2)+(k_2-k_1)\ (L_S+L_1)-2k_1\Delta L$. The difference $\Delta(\phi_R-\phi_S)$ between the phases of the beat signals shown in equations beam of the other pair of beams having a high frequency to pass through a predetermined optical path which causes the phase thereof to be changed in the same direction; and measuring information on the phase change by comparing the beat signals generated when the first pair of beams and the second pair of beams are superposed.

The apparatus of preferred embodiments of the present invention which achieves the above-described objects includes a light-beam former for forming a first pair of beams having different frequencies and a second pair of beams having different frequencies, both pairs of beams generating beat signals of the same frequency; an optical unit for superposing the first pair of beams and the second pair of beams after a light beam of one of the pair of beams having a low frequency and a light beam of the other pair of beams having a high frequency are caused to pass a predetermined optical path for causing the phase to be changed in the same direction; and a phase change information detector for measuring information on the phase change by comparing the beat signals generated when the first pair of beams and the second pair of beams are superposed.

Objectives and advantages in addition to those discussed above shall be apparent to those skilled in the art from the description of the preferred embodiments of the invention which follow. In the description, reference is made to the accompanying drawings, which form a part hereof, and which illustrate an example of the invention. Such example, however, is not exhaustive of the various embodiments of the invention, and therefore reference is made to the appended claims for determining the scope of the invention.

BRIEF DESCRIPTION OF THE DRAWINGS

FIG. 2B shows waveforms illustrating the principles of the present invention;

DESCRIPTION OF THE PREFERRED EMBODIMENTS

Figure 1:
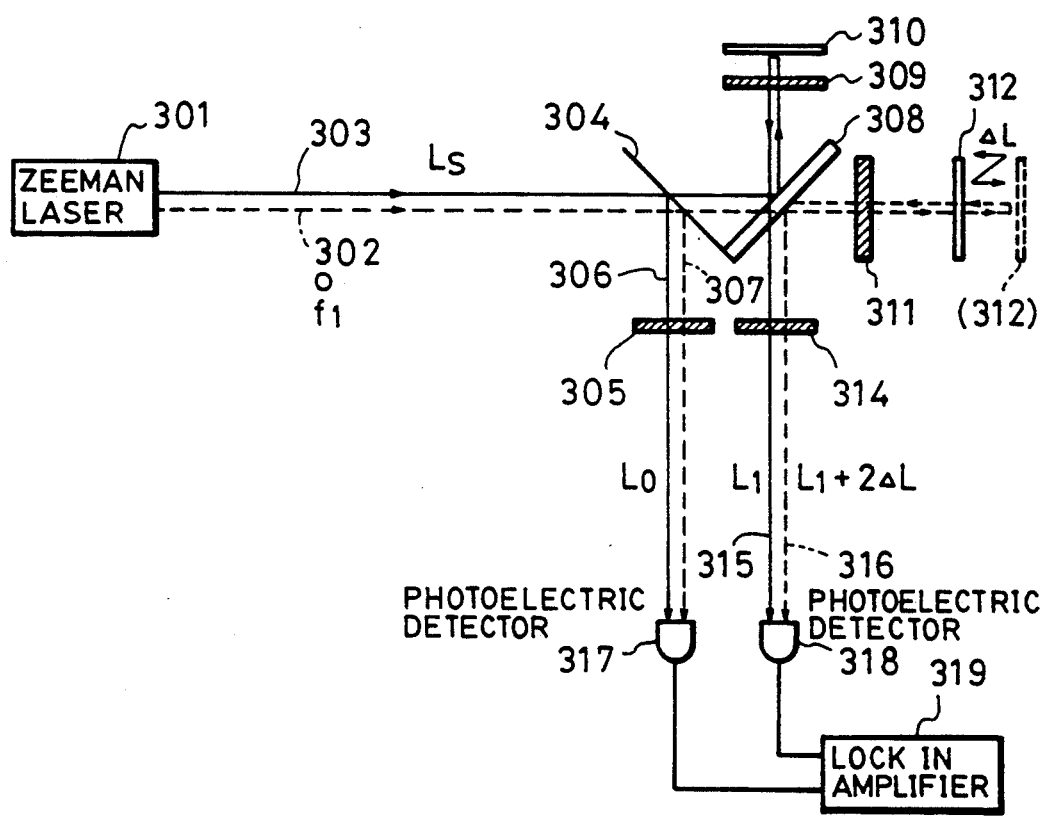
FIG. 1 is a view illustrating a very small displacement measuring apparatus of the prior art.

First, the principles of the embodiments of the present invention will be explained.

Light beams from a light source section which emits a light beam $f_1$ and a light beam $f_2$ whose frequencies are slightly different from each other is irradiated onto an object to be measured. The light beam $f_1$, which is reflected, diffracted, or scattered by the object to be measured, is interfered with the light beam $f_2$, which does not need to be reflected, diffracted, or scattered by the object to be measured and which has passed through a different optical path to form a first beat light beam. In the same manner as above, the light beam $f_2$, which is reflected, diffracted, or scattered by the object to be measured, is interfered with the light beam $f_1$, which does not need to be reflected, diffracted, or scattered by the object to be measured and which has passed through an optical path different from that passed through by the light beam $f_2$ to form a second beat light beam. A measuring apparatus is constructed so that the signs of the phases of respective beat light beams corresponding to a measured amount (e.g., a displacement amount) of an object to be measured are different. These two beat light beams are detected by different photoelectric detectors.

As a result of synchronously detecting two beat signals obtained in the above-mentioned way with a synchronization detector, an object is measured on the basis of the detected phase difference.

The change of a beat signal over a period of time is shown in FIG. 2B. In the prior art, detection signals of a reference light beam are always fixed, and no change in the phase occurs. This is made into a reference signal 13 in FIG. 2B. In contrast, in the detection signals of a signal light beam, a phase change of $\Delta\phi_0$ occurs according to the measured amount. The phase difference between these two signals is measured as a phase difference of $\Delta\phi_0$ by using a synchronization detector.

According to an embodiment of the present invention which will be described later, detection signals of the first beat light beam are designated by reference numeral 14 and detection signals $\Delta\phi_1$ of the second beat light beam are designated by reference numeral 14' in FIG. 2B. Phase differences of $\Delta\phi_1$ and $\Delta\phi_2$ are caused respectively according to the measured amount. A measuring apparatus is constructed so that two beat signals such that the signs of the phase changes $\Delta\phi_1$ and $\Delta\phi_2$ are different can be obtained. If the apparatus is set so that $\Delta\phi_1 = \Delta\phi_0$ and $\Delta\phi_1 = -\Delta\phi_0$, and if the phase difference between the two signals is measured by using a synchronization detector, $\Delta\phi = \Delta\phi_0 - (-\Delta\phi_0) = 2\Delta\phi_0$, a phase difference detected by the present measuring method is twice that measured by the conventional method.

The embodiments will be explained below specifically with reference to the accompanying drawings.

Figure 2A:
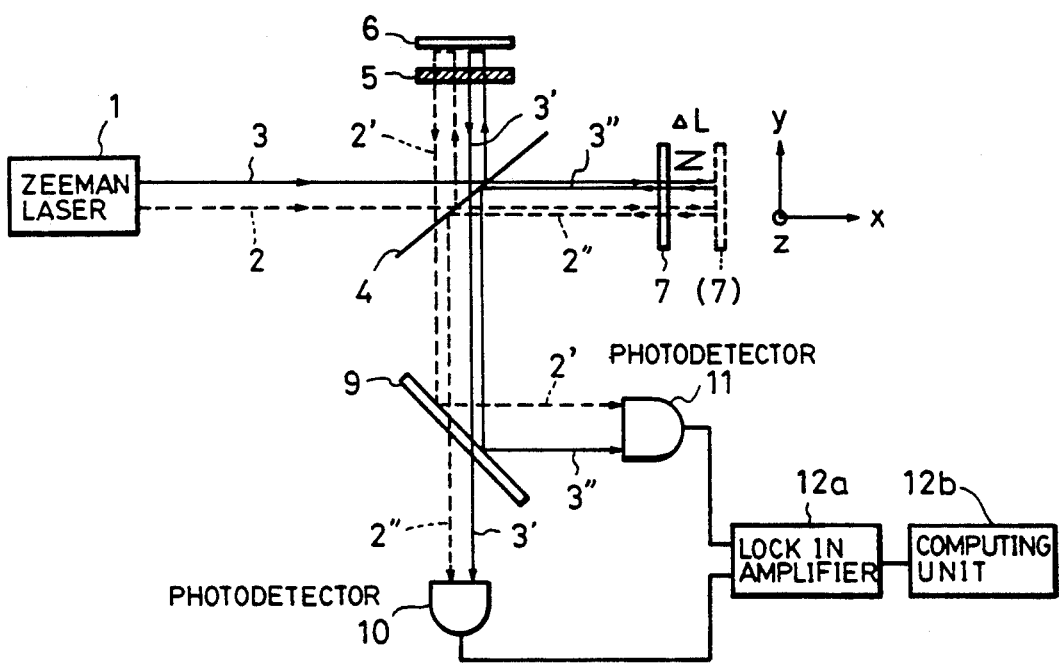
FIG. 2A is a view illustrating a first embodiment of the present invention.

FIG. 2A shows the first embodiment of the present invention, which is a very small displacement measuring apparatus. Polarized light 2 (P polarized, frequency $f_1$) and polarized light 3 (S polarized, frequency $f_2$) emitted from a Zeeman laser 1, which intersect at right angles with each other, are amplitude-divided by a beam splitter 4. Light beams 2' and 3' (reflected light beams of light beams 2 and 3 respectively) reflected by the beam splitter 4 are transmitted through a $\lambda/4$ plate 5. After the light beams are reflected by a mirror 6, they are again transmitted through the $\lambda/4$ plate 5 and reenter the beam splitter 4. At this time, the polarization direction is rotated by $\pi/2$ as a result of the light passing through a $\pi/4$ plate 5 twice. Light beam 2' becomes S polarized light from P polarized light, and light beam 3' becomes P polarized light from S polarized light. Of the light which has reentered and been transmitted through the beam splitter 4 (light which is reflected by the beam splitter 4 at this time is omitted in FIG. 2A), P polarized light 3' is transmitted through a beam splitter 9, and S polarized light 2' is reflected thereby.

On the other hand, light beams 2" and 3" (transmitted light of light beams 2 and 3 respectively) which have been transmitted through the beam splitter 4 after being emitted from the Zeeman laser 1, are reflected by an object 7 to be measured and enter the beam splitter 4 again.

Of the light (light which is transmitted through the beam splitter 4 at this time is omitted in FIG. 2A) which has reentered the beam splitter 4 and has been reflected thereby, p polarized light 2" is transmitted through the beam splitter 9, and S polarized light 3" is reflected thereby.

Light beams 2" and 3' which are transmitted through the polarization beam splitter 9 and light beams 2' and 3" reflected thereby form interference light beams because their polarization directions are aligned. These interference light beams are photoelectrically detected by photoelectric detectors 10 and 11. The difference between the phases of the signals obtained at that time is detected by using a lock-in amplifier 12a.

When the optical path length from the beam splitter 4 to the mirror 6 and that from the beam splitter 4 to the object 7 to be measured are equal, and when the distance from the polarization beam splitter 9 to the photoelectric detector 10 and that from the polarization beam splitter 9 to the photoelectric detector 11 are equal, the optical path length from the Zeeman laser 1 to the photoelectric detector 10 is equal to that from the Zeeman laser 1 to the photoelectric detector 11. If the optical path length at this time is denoted as L, a detection signal when the object 7 to be measured is displaced by $\Delta L$ in the X direction in this condition is as shown below. Complex amplitude displays $E_p(f_1)$ and $E_p(f_2)$ of light transmitted through the polarization beam splitter 9, in the photoreceptor portion of the photoelectric detector 10, can be expressed respectively as follows:

$$E_p(f_1) = A \exp [i\{(w_1 t + \phi_1 - k_1(L_1 + 2\Delta L))\}] \quad (1)$$

$$E_p(f_2) = B \exp [i\{(w_2 t + \phi_2 - k_2 L)\}] \quad (11)$$

where A and B are amplitudes, $w_1$ and $w_2$ are angular frequencies, $w_1 = 2\pi f_1$ and $w_2 = 2\pi f_2$, $\phi_1$ and $\phi_2$ are the initial phases of light emitted from the Zeeman laser 1, and $k_1$ and $k_2$ are the number of waves. If c denotes a light flux, the following relations are satisfied:

$$k_1 = \frac{2\pi}{c} f_1, \ k_2 = \frac{2\pi}{c} f_2$$

$E_p(f_1)$ and $E_p(f_2)$ interfere with each other because their polarization directions are aligned. A detection signal $I_1$ when this resulting interference light is photoelectrically detected by the photoelectric detector 10 is:

$$I_1 = A^2 + B^2 + 2AB \cos\{(w_1 - w_2) t + (\phi_1 - \phi_2) - 2k_1 \Delta L\} \quad (12)$$

On the other hand, complex amplitude displays $E_s(f_1)$ and $E_s(f_2)$ of light beams which are reflected by the polarization beam splitter 9, in the photoreceptor portion of the photoelectric detector 11, can be expressed respectively as follows:

$$E_s(f_1) = A \exp [i\{(w_1 t + \phi_1 - k_1 L)\}] \quad (13)$$

$$E_s(f_2) = B \exp [i\{(w_2 t + \phi_2 k_2(L + 2\Delta L))\}] \quad (14)$$

Since the polarization directions of $E_s(f_1)$ and $E_s(f_2)$ are aligned, they interfere with each other, A detection signal $I_2$ when this resulting interference light is photoelectrically detected by the photoelectric detector 11 is:

$$I_2 = A^2 + B^2 + 2AB \cos\{(w_1 - w_2) t + (\phi_1 - \phi_2) + 2k_2 \Delta L\} \quad (15)$$

A phase difference $\Delta\phi'$ between the phase of $I_2$ and that of $I_1$ can be determined as follows with the photoelectrically detected signals $I_1$ and $I_2$ as the two input signals to a lock-in amplifier 12a:

$$\Delta\phi' = 2(k_1 + k_2) \Delta L \quad (16)$$

$\Delta\phi'$ changes by $2(k_1 + k_2) \Delta L$ relative to the displacement $\Delta L$ of the object 7 to be measured.

By rearranging equation (16), it follows that:

$$\Delta L = \frac{\Delta\phi'}{2(k_1 + k_2)}$$

Thus, a displacement X can be determined by measuring the phase difference $\Delta\phi'$ between the beat signals. According to this method, a sensitivity about $(k_1 + k_2)/k_1$ times, or twice that of the prior art, can be obtained with respect to the displacement of an object to be measured because $k_1 \approx k_2$. That is, when a lock-in amplifier having the same accuracy is used, an accuracy twice that of the prior art can be obtained. The output of the lock-in amplifier 12a is input to an computing unit 12b, whereby $\Delta L$ is measured on the basis of the rearranged equation of equation (16).

Figure 3:
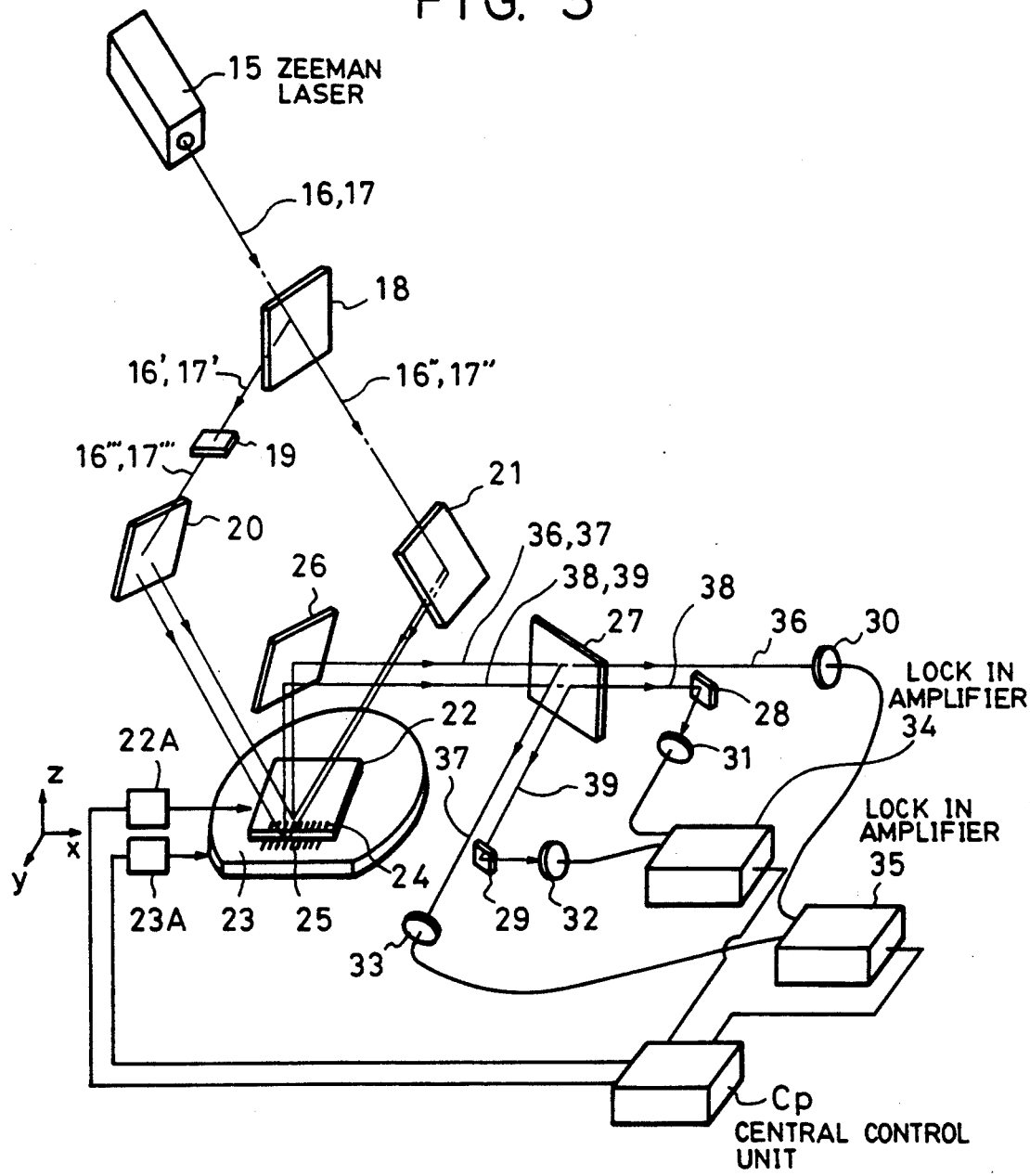
FIG. 3 is a view illustrating a second embodiment of the present invention.

FIG. 3 is a view illustrating the second embodiment of the present invention and shows the alignment section of a proximity exposure type semiconductor manufacturing apparatus which uses far-infrared rays, X rays or the like. The alignment of a mask 22 with a wafer 23 is performed by using an alignment mark 24 formed of a diffraction grating disposed on the mask 22 and an alignment mark 25 formed of a diffraction grating disposed on the mask 23. Polarized light beam 16 (P polarized, frequency $f_1$) and polarized light beam 17 (S polarized, frequency $f_2$) emitted from a Zeeman laser 15, which intersect at right angles with each other, are amplitude-divided by a beam splitter 18. Light beams 16' and 17' (reflected light beams of light beams 16 and 17 respectively) reflected by the beam splitter 18 are transmitted through a $\lambda/2$ plate 19. At this time, the polarization direction is rotated by $\pi/2$. Light beam 16' becomes an S polarized light beam 16''' (frequency $f_1$) from P polarized light, and light beam 17' becomes a P polarized light beam 17''' (frequency $f_2$) from S polarized light. Light beams 16''' and 17''' which have been transmitted through the $\lambda/2$ plate 19 change their courses by means of a mirror 20, and are irradiated onto both the diffraction grating 24 disposed on the mask 22 and the diffraction grating 25 disposed on the wafer 23.

In contrast, light beams 16'' and 17'' which have been transmitted through the beam splitter 18 (transmitted light beams of light beams 16 and 17, respectively) change their courses by means of a mirror 21, and are irradiated onto the diffraction grating 24 and the diffraction grating 25.

Figure 4:
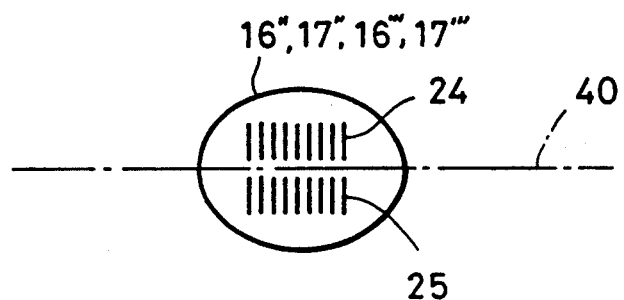
FIG. 4 is a top plan view illustrating a diffraction grating according to the second embodiment.

The diffraction gratings 24 and 25 are reflection type evenly-spaced linear diffraction gratings. Their pitches are equal, the value being P. FIG. 4 shows the arrangement of the alignment marks 24 and 25, seen from the direction of the normal line of the mask 22 and the wafer 23, and irradiated light. Of the light diffracted by the diffraction grating, the diffracted light to the left side (the $-x$ side), when the X-Z plane on the figure toward the traveling direction of the 0-th order diffracted light (regularly reflected light) is seen from the $+y$ side, is made into $+m$-th diffracted light, whereas light diffracted 25 to the right side ($+x$ side) is made into $-m$-th order diffracted light. It is generally well known that, when a diffraction grating moves one pitch in a direction (the $+x$-axis direction in FIG. 3) perpendicular to the grating patterns of the diffraction grating, the phase of the diffracted light changes by $2m\pi$. When the diffraction grating 24 is moved by $x_M$ in a x direction from a reference position, and when the diffraction grating 25 is moved by $x_W$ in a x direction from a reference position, a phase change of $\pm 2m\pi x_M/P \pm 2m\pi x_W/P$ is applied to the light diffracted by each diffraction grating. The incident angles of $\pm$first-order diffracted light used for measurements from the diffraction gratings 24 and 25 are set so that they are diffracted in the direction of the normal line of the diffraction grating 24 and that of the diffraction grating 25. Light diffracted in the direction of the normal line will be considered.

Complex amplitude displays $E_{MS}(f_1)$ and $E_{MP}(f_2)$ of +first-order diffracted light of the left-side incident light 16''' and 17''' by means of the diffraction grating 24, and complex amplitude displays $E_{MP}(f_1)$ and $E_{MS}(f_2)$ of −first-order diffracted light of the right-side incident light 16' and 17' are as shown in the following equations:

$$E_{MS}(f_1) = A \exp\{i(w_1 t + \phi_1 + \phi_M)\} \quad (17)$$

$$E_{MS}(f_2) = B \exp\{i(w_2 t + \phi_2 + \phi_M)\} \quad (18)$$

$$E_{MP}(f_1) = A \exp\{i(w_1 t + \phi_1 - \phi_M)\} \quad (19)$$

$$E_{MP}(f_2) = B \exp\{i(w_2 t + \phi_2 - \phi_M)\} \quad (20)$$

where A and B are amplitudes, $w_1$ and $w_2$ are angular frequencies, $\phi_1$ and $\phi_2$ are the initial phases of light emitted from the Zeeman laser 15, and $\phi_M = 2\pi x_M/P$. In the same manner as above, complex amplitude displays $E_{WS}(f_1)$ and $E_{WP}(f_2)$ of the +first-order diffracted light beams of the left-side incident light beams 16''' and 17''' by means of the diffraction grating 25, and complex amplitude displays $E_{WP}(f_1)$ and $E_{WS}(f_2)$ of the −first-order diffracted light beams of the right-side incident light beams 16'' and 17'' are as shown in the following equations:

$$E_{WS}(f_1) = A \exp\{i(w_1 t + \phi_1 + \phi_W)\} \quad (21)$$

$$E_{WP}(f_2) = B \exp\{i(w_2 t + \phi_2 + \phi_W)\} \quad (22)$$

$$E_{WP}(f_1) = A \exp\{i(w_1 t + \phi_1 - \phi_W)\} \quad (23)$$

$$E_{WS}(f_2) = B \exp\{i(w_2 t + \phi_2 - \phi_W)\} \quad (24)$$

where $\phi_w = 2\pi X_W/P$.

Those light beams in which polarization planes of the light beams diffracted by the diffraction gratings 24 and 25 are aligned, interfere with each other, and four interference light beams are obtained. Of the light beams diffracted by the diffraction grating 24, P polarized light beams are expressed by equations (18) and (19). The intensity change $I_{MP}$ of an interference light 36 is:

$$I_{MP} = A^2 + B^2 + 2AB \cos\{(w_2 - w_1)t + (\phi_2 - \phi_1) - 2\phi_M\} \quad (25)$$

In the same manner as above, S polarized light beams are expressed by equations (17) and (20). The intensity change $I_{MS}$ of an interference light beam 37, intensity changes $I_{WP}$ and $I_{WS}$ of an interference light beam 38 of P polarization of equations (22) and (23), and of an interference light beam 39 of S polarization of equations (21) and (24), can be expressed by the following equations:

$$I_{MS} = A^2 + B^2 + 2AB \cos\{(w_2 - w_1)t + (\phi_2 - \phi_1) - 2\phi_M\} \quad (26)$$

$$I_{WP} = A^2 + B^2 + 2AB \cos\{(w_2 - w_1)t + (\phi_2 - \phi_1) + 2\phi_W\} \quad (27)$$

$$I_{WS} = A^2 + B^2 + 2AB \cos\{(w_2 - w_1)t + (\phi_2 - \phi_1) - 2\phi_W\} \quad (28)$$

These four interference light beams are detected independently of each other by photoelectric detectors 30, 33, 31 and 32.

The respective interference light beams may be separated as described in the examples below.

The direction of the light diffracted by the diffraction gratings 24 and 25 is changed by a mirror 26 and guided to a polarization beam splitter 27. As a result, P polarized interference light beams 36 and 38 are transmitted therethrough and S polarized interference light beams 37 and 39 are reflected thereby, the beams being divided into two.

The edge mirrors 28 and 29 are arranged in such a way that outgoing light from near a diffraction grating is spatially separated by a boundary line 40 shown in FIG. 4, seen from the plane where the diffraction grating exists. This arrangement causes the interference light beams 36 and 37 of the light diffracted by the diffraction grating 24 and the interference light beams 36 and 37 of the light diffracted by the diffraction grating 25 to be divided into two. Respective interference light beams separated in this manner are converted into electrical signals by the photoelectric detectors 30, 31, 32 and 33 (e.g., avalanche photodiodes) and guided to lock-in amplifiers 34 and 35. When a phase deviation $\Delta T_M$ between the beat signals having a frequency of $w_1 - w_2$, caused by the light beams 36 and 37 diffracted by the diffraction grating 24, shown in equations (25) and (26), is detected by using the lock-in amplifier 35, it is expressed as follows:

$$\Delta T_M = 4\phi_M = \frac{8\pi}{P} X_M$$

The amount of deviation $X_M$ of the mask 22 along the x orientation is determined by detecting the phase with the lock-in amplifier 35. In similar manner, a phase deviation $\Delta T_W$ between the signals shown in equations (27) and (28) is detected by using the lock-in amplifier 34, it is expressed as follows:

$$\Delta T_W = 4\phi_W = \frac{8\pi}{P} X_W$$

Thus, the amount Of the deviation $X_W$ of the wafer 23 along the x orientation can be determined. The mask 22 can be aligned with the wafer 23 by causing the wafer to move so that the amounts of the deviation of the mask 22 and the wafer 23 along the x orientation are equal.

If the pitches of the diffraction gratings 24 and 25 are set at 2 $\mu$m; the central wavelength of light emitted from the Zeeman laser 15 is set at $\lambda = 0.6328$ $\mu$m; and the diffraction angle of $\pm$first-order diffracted light when light is incident perpendicularly to the diffraction gratings 24 and 25 is denoted as $\theta \pm 1$, then $\theta \pm 1 = \sin^{-1}(0.6328/2) = 18.4°$ on the basis of the relation of:

$$\theta \pm m = \sin(m\lambda/P) \quad (m = \text{order of diffraction}) \quad (29)$$

Therefore, to cause light incident on the diffraction gratings 24 and 25 to be diffracted upward perpendicularly to the mask 22 and the wafer 23, the mirrors 20 and 21 should be set so that the right and left incident angles are equal to $\theta \pm 1$.

The determination of the amount of the deviation of the diffraction grating 24 on the mask 22 and of the diffraction grating 25 on the wafer 23, on the basis of the above-described principles, enables the alignment of a semiconductor exposure apparatus to be precisely detected. In this way, in this embodiment, two light beams having different frequencies ($f_1$ and $f_2$) which form beat signals are made incident so that they are arranged opposite to each other with respect to the direction (along the x orientation) in which a positional deviation should be detected. Detection of position is performed on the basis of the phase deviation between the beat signals formed by each pair of two pairs of light beams. Therefore, when the detection of position performed on the basis of the phase deviation of beat signals formed by one of the pairs of light beams of these two pairs of light beams is compared with the detection of position performed from the phase deviation of beat signals whose phase is fixed, the phase deviation is twice the amount of positional deviation. Therefore the position deviation detection resolution is increased two-fold.

Outputs from the lock-in amplifiers 34 and 35 are sent to a central control unit $C_P$, whereby the amount of deviation of the mask from the wafer is detected (or the presence and direction of the deviation). In response to the deviation detection, a drive command signal is issued to at least either one of a well-known mask actuator 22A for driving a mask in the x direction and a well-known wafer actuator 23A for driving a wafer in the x direction, and the mask is aligned with the wafer. One set of these actuators is disposed along the y orientation, and alignment along the y orientation is performed in similar fashion as that along the x orientation, though this has been omitted in the explanation.

Figure 5:
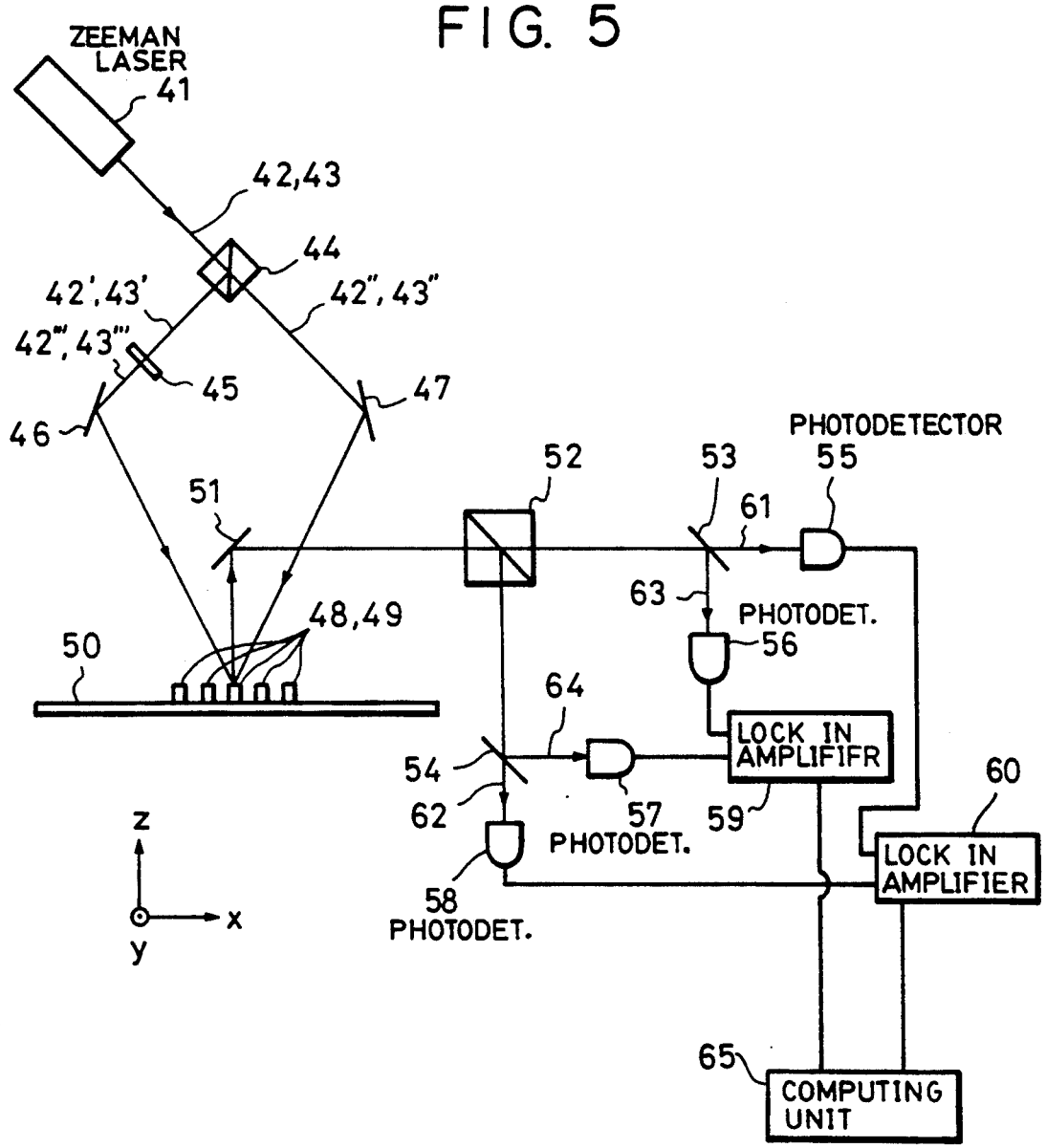
FIG. 5 is a view illustrating a third embodiment of the present invention.

FIG. 5 illustrates the third embodiment of the present invention and shows a brazing superposition evaluation apparatus for precisely detecting and evaluating the deviation of positions between two brazing superposition evaluation patterns brazed by two exposures. Polarized light 42 (P polarized, frequency $f_1$) and polarized light 43 (S polarized, frequency $f_2$) emitted from a Zeeman laser 41, which intersect at right angles with each other, are amplitude-divided by a beam splitter 44. Light beams 42' and 43' (the reflected light beams of light beams 42 and 43 respectively) reflected by the beam splitter 44 are transmitted through a $\lambda/4$ plate 45. At this time, the polarization direction is rotated by $\pi/2$. Light beam 42' becomes an S-polarized light beam 42''' from P polarized light beam, and light beam 43' becomes a P-polarized light beam 43''' from S polarized light. The course of the light beams 42''' and 43''' which have been transmitted through the $\lambda/4$ plate 45 is deflected by a mirror 46 and the light beams are irradiated onto the entire surface of diffraction gratings 48 and 49 disposed on a wafer 50. The diffraction gratings 48 and 49 disposed on the wafer 50 are two adjacent evenly-spaced linear diffraction gratings, shown in FIG. 6, formed on a wafer through several brazing processes. Their pitches are equal, being P. A deviation $\Delta x$ in position during brazing is caused along the x orientation between the diffraction gratings 48 and 49.

On the other hand, the course of light beams 42'' and 43'' (transmitted light beams of the light beams 42 and 43) is changed by a mirror 47, and the light beams are irradiated onto the diffraction gratings 48 and 49. At this time, complex amplitude displays $E_{AS}(f_1)$ and $E_{AP}(f_2)$ of +first-order diffracted light of the left-side incident light 42''' and 43''' by means of the diffraction grating 48, and complex amplitude displays $E_{AP}(f_1)$ and $E_{AS}(f_2)$ of −first-order diffracted light of the right-side incident light 42'' and 43'' are as shown in the following equations:

$$E_{AS}(f_1) = A \exp\{i(w_1 t + \phi_1 + \phi_A)\} \quad (30)$$

$$E_{AP}(f_2) = B \exp\{i(w_2 t + \phi_2 + \phi_A)\} \quad (31)$$

$$E_{AP}(f_1) = A \exp\{i(w_1 t + \phi_1 - \phi_A)\} \quad (32)$$

$$E_{AS}(f_2) = B \exp\{i(w_2 t + \phi_2 - \phi_A)\} \quad (33)$$

where A and B are amplitudes, $w_1$ and $w_2$ are angular frequencies, $\phi_1$ and $\phi_2$ are the initial phases of light emitted from the Zeeman laser 41, and $\phi_A = 2\pi x_A/P$. Also, respective complex amplitude displays $E_{BS}(f_1)$ and $E_{BP}(f_2)$ of −first-order diffracted light of the left-side incident light 42''' and 43''' by means of the diffraction grating 49, and complex amplitude displays $E_{BP}(f_1)$ and $E_{BS}(f_2)$ of +first order diffracted light of the right-side incident light 42'' and 43'' are as shown in the following equations:

$$E_{BS}(f_1) = A \exp\{i(w_1 t + \phi_1 + \phi_B)\} \quad (34)$$

$$E_{BP}(f_2) = B \exp\{i(w_2 t + \phi_2 + \phi_B)\} \quad (35)$$

$$E_{BP}(f_1) = A \exp\{i(w_1 t + \phi_1 - \phi_B)\} \quad (36)$$

$$E_{BS}(f_2) = B \exp\{i(w_2 t + \phi_2 - \phi_B)\} \quad (37)$$

where $\phi_B = 2\pi x_B/P$. In the above equations, $x_A$ and $x_B$ denote the amount of deviation of the diffraction gratings 48 and 49 from a reference position in the x direction, respectively.

Those light beams in which polarization planes of the light beams diffracted by the diffraction gratings 48 and 49 are aligned, interfere with each other, and four interference light beams are obtained. Of the light beams diffracted by the diffraction grating 48, P polarized light beams are expressed by equations (31) and (32). The intensity change $I_{AP}$ of an interference light 61 is:

$$I_{AP} = A^2 + B^2 + 2AB \cos\{(w_2 - w_1)t + (\phi_2 - \phi_1) - 2\phi_A\} \quad (38)$$

In similar manner, S polarized light beams are expressed by equations (30) and (33). The intensity change $I_{AS}$ of an interference light beam 62, intensity changes $I_{BP}$ and $I_{BS}$ of an interference light beam 63 of P polarization of equations (35) and (36), and of an interference light beam 64 of S polarization of equations (39) and (37), can be expressed by the following equations:

$$I_{AS} = A^2 + B^2 + 2AB \cos\{(w_2 - w_1)t + (\phi_2 - \phi_1) - 2\phi_A\} \quad (39)$$

$$I_{BP} = A^2 + B^2 + 2AB \cos\{(w_2 - w_1)t + (\phi_2 - \phi_1) + 2\phi_B\} \quad (40)$$

$$I_{BS} = A^2 + B^2 + 2AB \cos\{(w_2 - w_1)t + (\phi_2 - \phi_1) - 2\phi_B\} \quad (41)$$

Figure 7:
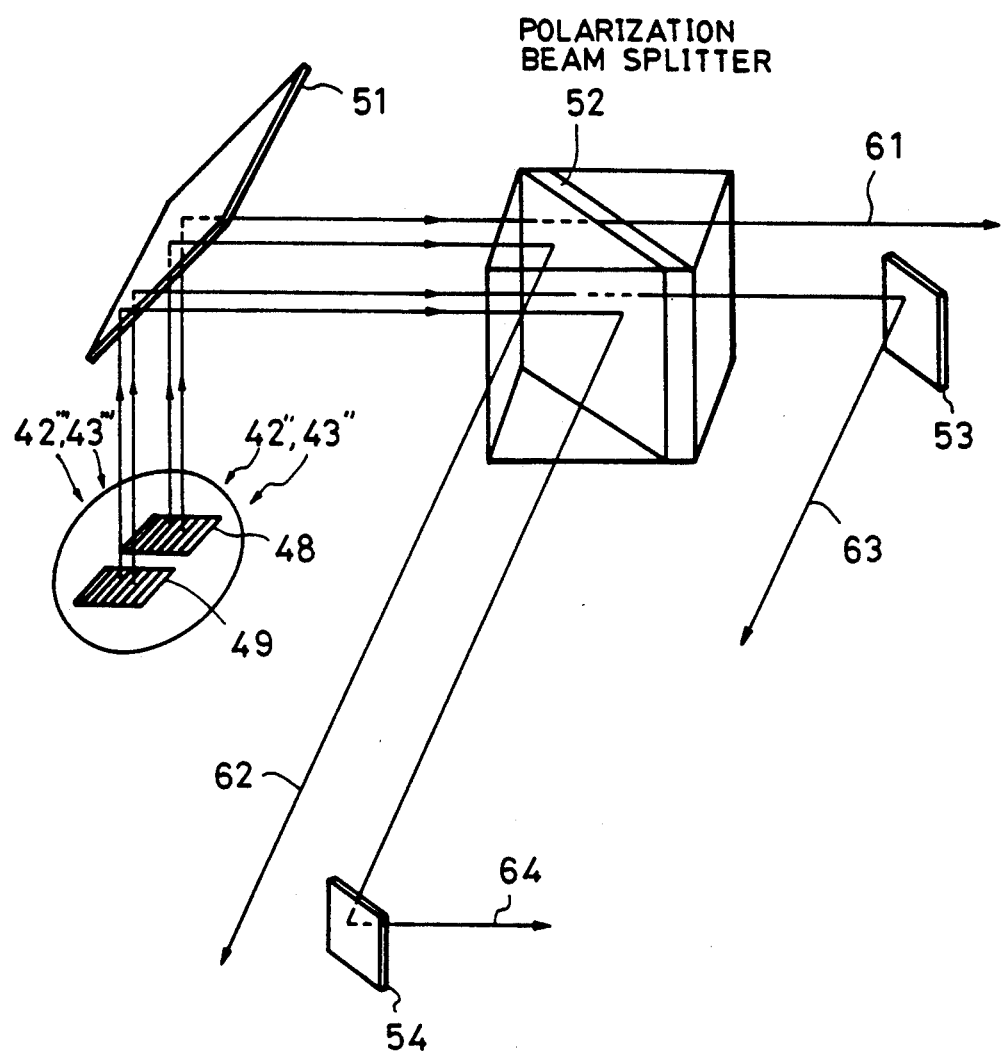
FIG. 7 is an enlarged view of an interference system according to the third embodiment.

These interference light beams are separated and photoelectrically detected in order to detect beat signals of an angular frequency of $w_2 - w_1$. The respective interference light beams may be separated as shown below. The state of the separation of the interference light beams is shown in FIG. 7. The direction of the light beam diffracted by the diffraction gratings 48 and 49 is changed by a mirror 51 and guided to a polarization beam splitter 52. As a result, the interference light beams 61 and 63 of P polarization are transmitted through it, and the interference light beams 62 and 64 of S polarization are reflected by it, being divided into two.

The interference light beams 61 and 63 of light beams each diffracted by the diffraction gratings 48 and 49 respectively are divided into two by an edge mirror 53. The interference light beams 62 and 64 of light beams each diffracted by the diffraction gratings 48 and 49 respectively are divided into two by an edge mirror 54. Respective interference light beams are converted into electrical signals by photoelectric detectors 55, 56, 57 and 58 and guided to lock-in amplifiers 59 and 60. When the amount of the phase deviation $\Delta T_A$ between the signals shown in equations (38) and (39) is detected by using the lock-in amplifier 60, it is expressed as follows:

$$\Delta T_A = 4\phi_A = \frac{8\pi}{P} X_A$$

Thus, the deviation $X_A$ of the diffraction grating 48 along the x orientation is determined on the basis of the phase of the output of the lock-in amplifier 60. In similar manner, when a phase deviation $\Delta T_B$ between the signals shown in equations (40) and (41) is detected, it is expressed as follows:

$$\Delta T_B = 4\phi_B = \frac{8\pi}{P} X_B$$

Thus, the deviation $X_B$ of the diffraction grating 49 along the x orientation can be determined. Furthermore, the relative deviation $\Delta x$ between the diffraction gratings 48 and 49 can be determined by a computing unit 65 that computes the difference between the $X_A$ and $X_B$ on the basis of the outputs of the lock-in amplifiers 59 and 60. In this embodiment, the phase deviation of beat signals with respect to a predetermined deviation amount is twice that when a phase difference is determined with the beat signals whose phase is fixed as a reference.

Brazing superposition evaluation by a semiconductor exposure apparatus can be performed by determining the deviation between a first brazed grating pattern and a second brazed grating pattern on the basis of the above-described principles. Grating patterns are brazed, for example, by each of two exposures with a predetermined stage movement performed. Then, the above-described brazing superposition evaluation is performed. Thus, stage evaluation of the exposure apparatus can be made. In addition, after the first brazing is performed, alignment is performed. After a second exposure brazing, if the above-described superposition evaluation is performed, alignment can be evaluated.

Figure 8:
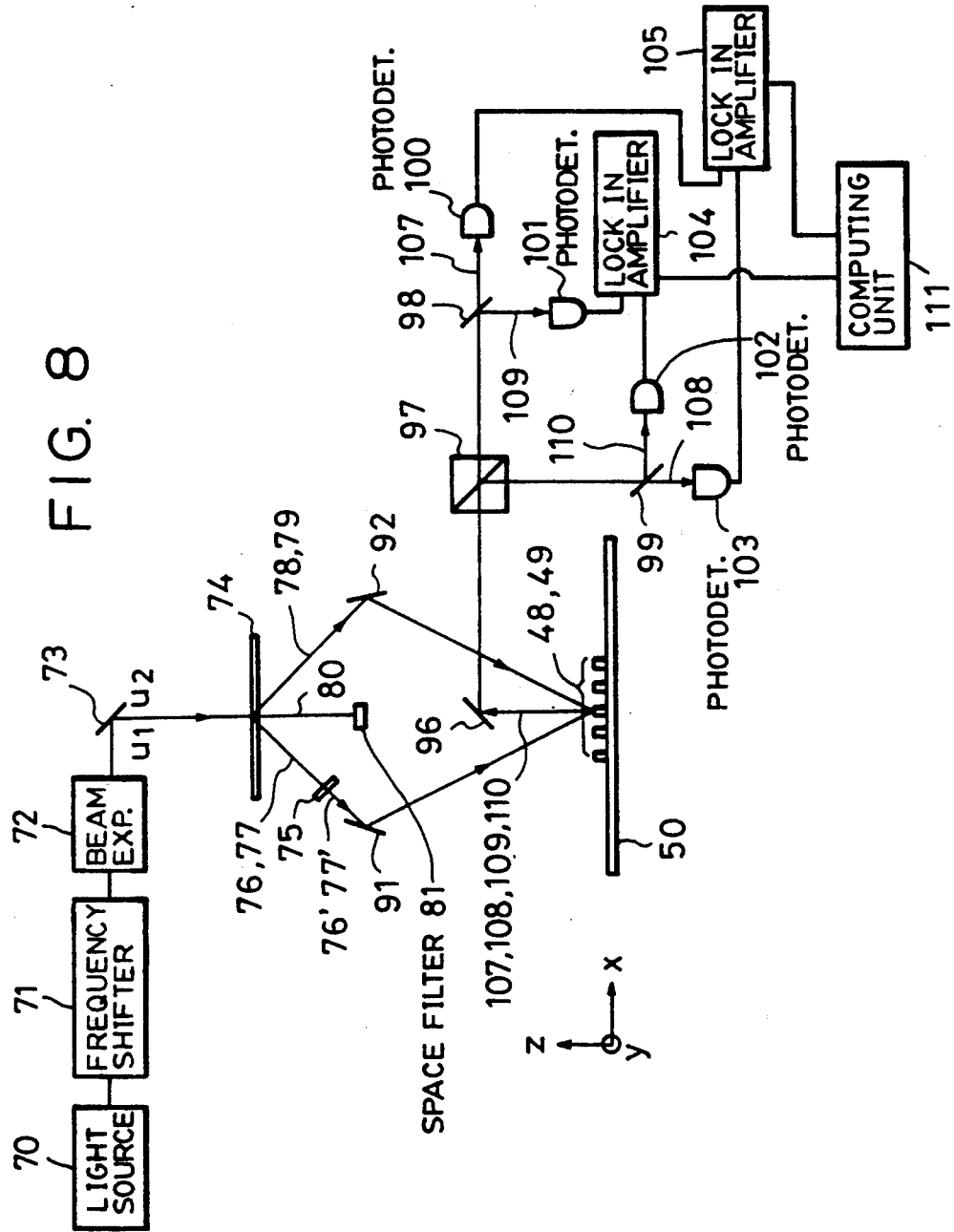
FIG. 8 is a view illustrating a fourth embodiment of the present invention.

FIG. 8 illustrates the fourth embodiment of the present invention and shows a superposition measuring apparatus of a semiconductor exposure apparatus. In the third embodiment shown in FIG. 5, a case in which, light beams emitted from the Zeeman laser 41 are amplitude-divided by a beam splitter 44 and irradiated onto the diffraction gratings 48 and 49 on the wafer 50, has been described. However, in this embodiment shown in FIG. 8, light beams emitted from a light source 70, such as a laser, are made into light beams $u_1$ (P polarization, frequency $f_1$) and $u_2$ (S polarization, frequency $f_2$) whose frequencies f are slightly different from each other and which intersect at right angles with each other, by means of a frequency shifter 71. Complex amplitude displays of respective light beams $u_1$ and $u_2$ are as shown in the equations show below if $\phi_1$ and $\phi_2$ denote the initial phases, $C_{10}$ and $C_{20}$ denote amplitudes, $w_1$ and $w_2$ denote angular frequencies, and $w_1 = 2\pi f_1$ and $w_2 = 2\pi f_2$:

$$u_1 = C_{10} \exp \{i(w_1 t + \phi_1)\} \quad (42)$$

$$u_2 = C_{20} \exp \{i(w_2 t + \phi_2)\} \quad (43)$$

The diameters of the two light beams $u_1$ and $u_2$, on a common optical path, are condensed by a beam expander 72. The direction of travel of the light beams is changed by a mirror 73 and made to perpendicularly enter a linear diffraction grating 74 (gratings are arrayed in the direction from left to right in the diagram, and grating patterns extend in a direction perpendicular to the diagram). In the case of a transmission-type diffraction grating, diffracted light on the right side (the $+x$ side) with respect to the direction of the traveling of 0-th order diffracted light (positive reflected light), when the x-z plane on the diagram of FIG. 8 is seen from the $+y$ side, is made into $+m$-th order diffracted light. Diffracted light on the left side (the $-x$ side) is made into $-m$-th order diffracted light. In the case of a reflection-type diffraction grating, the reverse applies. Generally, when a diffraction grating is moved one pitch perpendicularly to the grating pattern of the diffraction grating (the x orientation in FIG. 8), the phase of the diffracted light changes by $2m\pi$ with m as the order of diffraction. Therefore, when the diffraction grating 74 is moved by $x_A$ along the x orientation from a reference position, phases of $-2\pi x_A/P$ and $2\pi x_A/P$ are applied to first-order diffracted light beams 76 and 77 (diffracted light beams of $u_1$ and $u_2$, respectively) and $-$first-order diffracted light 78 and 79 (diffracted light beams of $u_1$ and $u_2$, respectively) where the pitch of the diffraction grating 74 as P. Complex amplitudes $u_1(1)$, $u_2(1)$, $u_1(-1)$ and $u_2(-1)$ (parentheses denote the order of diffraction) of ±first-order diffracted light beams 76, 77, 78 and 79 from the diffraction grating are expressed as follows if $C_{11}$ and $C_{21}$ denote amplitudes:

$$u_1(1) = C_{11} \exp \{i(w_1 t + \phi_1 + \phi_A)\} \quad (44)$$

$$u_2(1) = C_{21} \exp \{i(w_2 t + \phi_2 + \phi_A)\} \quad (45)$$

$$u_1(-1) = C_{11} \exp \{i(w_1 t + \phi_1 - \phi_A)\} \quad (46)$$

$$u_2(-1) = C_{21} \exp \{i(w_2 t + \phi_2 - \phi_A)\} \quad (47)$$

where $\phi_A = 2\pi X_A/P$.

A 0-th order diffracted light 80 is removed, for example, by a space filter 81 so that it cannot enter the diffraction gratings 48 and 49 on the wafer 50. The first-order diffracted light beams 76 and 77 become light beams 76' and 77' in which their respective polarization planes are rotated by 90° by a ½ wavelength plate 75. The courses of the diffracted light beams 76' and 77', and 78 and 79 are changed by mirrors 91 and 92, respectively, and the beams are irradiated onto the entire surface of the diffraction gratings 48 and 49 disposed on the wafer 50.

Figure 6:
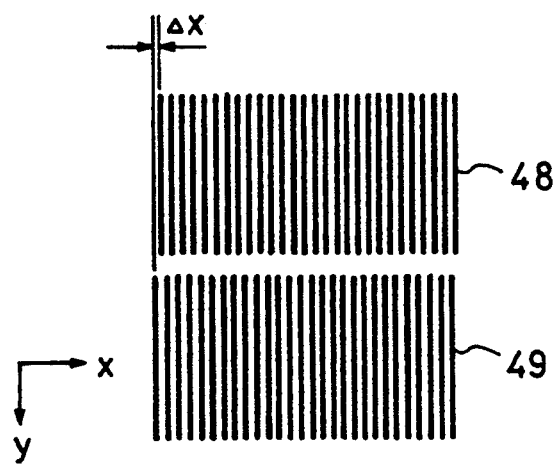
FIG. 6 is a view of the arrangement of a detection pattern (diffraction grating) according to the third embodiment.

The diffraction gratings 48 and 49 disposed on the wafer 50 are two adjacent evenly-spaced linear diffraction gratings shown in FIG. 6, as in the third embodiment. Their pitches are equal, being P. A deviation $\Delta x$ is caused along the x orientation between the diffraction gratings 48 and 49.

At this time, first-order diffracted light beams $u_{1B}(1, 1)$ and $u_{2B}(1, 1)$ of light beams 76' and 77' diffracted by the diffraction grating 48, and −first-order diffracted light beams $u_{1B}(-1, -1)$ and $u_{2B}(-1, -1)$ of light beams 78 and 79, are expressed as follows:

$$u_{1B}(1, 1) = C_{1B} \exp \{i(w_1 t + \phi_1 + \phi_A + \phi_B)\} \quad (48)$$

$$u_{2B}(1, 1) = C_{2B} \exp \{i(w_2 t + \phi_2 + \phi_A + \phi_B)\} \quad (49)$$

$$u_{1B}(-1, -1) = C_{1B} \exp \{i(w_1 t + \phi_1 - \phi_A - \phi_B)\} \quad (50)$$

$$u_{2B}(-1, -1) = C_{2B} \exp \{i(w_2 t + \phi_2 - \phi_A - \phi_B)\} \quad (51)$$

where $C_{1B}$ and $C_{2B}$ are amplitudes, and $\phi_B = 2\pi X_B/P$. Also, first-order diffracted light beams $u_{1C}(1, 1)$ and $u_{2C}(1, 1)$ of light beams 76' and 77' diffracted by the diffraction grating 48, and −first-order diffracted light beams $u_{1C}(-1, -1)$ and $u_{2C}(-1, -1)$ of light beams 78 and 79, are expressed as follows:

$$u_{1C}(1, 1) = C_{1C} \exp \{i(w_1 t + \phi_1 + \phi_A + \phi_C)\} \quad (48)$$

$$u_{2C}(1, 1) = C_{2C} \exp \{i(w_2 t + \phi_2 + \phi_A + \phi_C)\} \quad (49)$$

$$u_{1C}(-1, -1) = C_{1C} \exp \{i(w_1 t + \phi_1 - \phi_A - \phi_C)\} \quad (50)$$

$$u_{2C}(-1, -1) = C_{2C} \exp \{i(w_2 t + \phi_2 - \phi_A - \phi_C)\} \quad (51)$$

where $C_{1C}$ and $C_{2C}$ are amplitudes, and $\phi_C = 2\pi X_C/P$. In the above equations, $X_B$ and $X_C$ denote the deviation of the diffraction gratings 48 and 49 along the x orientation from the same reference position, respectively.

Those light beams in which polarization planes of the light beams diffracted by the diffraction gratings 48 and 49 are aligned, interfere with each other, and four interference light beams are obtained. Of the light beams diffracted by the diffraction grating 48, P polarized light beams are expressed by equations (49) and (50). The intensity change $V_{BP}$ of the resulting interference light beam 107 is:

$$V_{BP} = C^2_{1B} + C^2_{2B} + 2C_{1B}C_{2B} \cos \{(w_2 - w_1) + (\phi_2 - \phi_1) + 2(\phi_B + \phi_A)\} \quad (56)$$

In similar manner, S polarized light beams are expressed by equations (48) and (51). The intensity change $V_{BS}$ of the resulting interference light beam 108, intensity changes $V_{CP}$ and $V_{CS}$ of an interference light beam 109 of P polarization of equations (53) and (54), and of an interference light beam 110 of S polarization of equations (52) and (55) of the light beams diffracted by the diffraction grating 49, can be expressed by the following equations:

$$V_{BS} = C^2_{1B} + C^2_{2B} + 2C_{1B}C_{2B} \cos \{(w_2 - w_1) + (\phi_2 - \phi_1) + 2(\phi_B + \phi_A)\} \quad (57)$$

$$V_{CP} = C^2_{1C} + C^2_{2C} + 2C_{1C}C_{2C} \cos \{(w_2 - w_1) + (\phi_2 - \phi_1) + 2(\phi_C + \phi_A)\} \quad (58)$$

$$V_{CS} = C^2_{1C} + C^2_{2C} + 2C_{1C}C_{2C} \cos \{(w_2 - w_1) + (\phi_2 - \phi_1) + 2(\phi_C + \phi_A)\} \quad (59)$$

The respective interference light beams may be separated as described in the examples below.

The course of the light beam diffracted by the diffraction gratings 48 and 49 is changed by a mirror 96, and guided to a polarization beam splitter 97. As a result, interference light beams 107 and 109 of P polarization are transmitted through the polarization beam splitter 97, and interference light beams 108 and 110 are reflected thereby, the beams being divided into two. In addition, the light beams are divided into the following two beams by mirrors 98 and 99: (a) interference light beams 107 and 108 of light diffracted by the diffraction grating 48, and (b) interference light beams 109 and 110 of light diffracted by the diffraction grating 49. Respective interference light beams separated in this manner are converted into electrical signals by the photoelectric detectors 100, 101, 102 and 103 (e.g., avalanche photodiodes) and guided to lock-in amplifiers 104 and 105.

In equations (56), (57), (58) and (59), $C^2_{1B} + C^2_{2B}$, and $C^2_{1C} + C^2_{2C}$ are DC components, $2C_{1B}C_{2B}$ and $2C_{1C}C_{2C}$ are amplitudes of the frequency of $f_2 - f_2$. Signals having beat frequency components of $f_2 - f_2$ undergo the initial phase deviation of $\phi_{2-1}$, and are phase-modulated over a period of time by deviation $2(\phi_B + \phi_A)$, $-2(\phi_B + \phi_A)$ for the diffraction grating 74 of the diffraction grating 48 in the case of equations (56) and (57), and by the deviation $2(\phi_C + \phi_A)$, $-2(\phi_C + \phi_A)$ for the diffraction grating 74 of the diffraction grating 49 in the case of equations (58) and (59). Therefore, if a deviation over a period of time between the two signals is detected with one of the signals shown in equations (56) and (57) as a reference signal and the other as a signal to be measured, the initial phase of the light beam can be erased, making highly precise position detection possible in so-called heterodyne interference measurement.

As described above, since, in the heterodyne interference method, a phase deviation between two signals is detected as time and not affected by a difference between DC components of signals or changes in their amplitudes. When the phase deviation $\Delta T_B$ between the signals shown in equations (56) and (57) is detected by using the lock-in amplifier 105, the amount of relative deviation between the diffraction gratings 74 and 48 along the x orientation can be determined on the basis of the equation:

$$\Delta T_B = \frac{8\pi}{p}(X_B + X_A)$$

In similar manner, when the phase deviation $\Delta T_C$ between the signals shown in equations (58) and (59) is detected by using the lock-in amplifier 104, the amount of relative deviation between the diffraction gratings 74 and 49 along the x orientation can be determined on the basis of the equation:

$$\Delta T_C = \frac{8\pi}{p}(X_C + X_A)$$

In addition, the relative deviation between the diffraction gratings 48 and 49 can be determined by measuring the difference between the deviation between the diffraction gratings 74 and 48, and the deviation between the diffraction gratings 74 and 49. The above is performed by a computing unit 111 when the outputs from the lock-in amplifiers 104 and 105 are received. In this embodiment, also, a phase deviation for the same deviation is two times greater than that using beat signals whose phases are fixed as a reference. If the pitches of the diffraction gratings 74, 48 and 49 are set at 2 μm, the wavelength of light emitted from the light source 70 is set at $\lambda=0.6328$ μm; and the diffraction angle of ±first-order diffracted light when light is incident perpendicularly to the diffraction grating 74 is denoted as $\theta_{\pm1}$, $\theta_{\pm1}=\sin^{-1}(0.6328/2)=18.4°$ on the basis of the relation:

$$\theta_{\pm m}=\sin(m\lambda/P) \quad (m: \text{order of diffraction}) \quad (60)$$

Therefore, to cause light incident on the diffraction gratings 48 and 49 to be diffracted upward perpendicularly to the wafer 23, the mirrors 91 and 92 should be set so that the right and left incident angles are equal to $\theta_{\pm1}$.

In this measurement, a phase difference can be detected at $\lambda/500$. The positional deviation between the diffraction gratings 74 and 48, or the positional deviation between the diffraction gratings 74 and 49 corresponds to 0.0021 μm.

Figure 9:
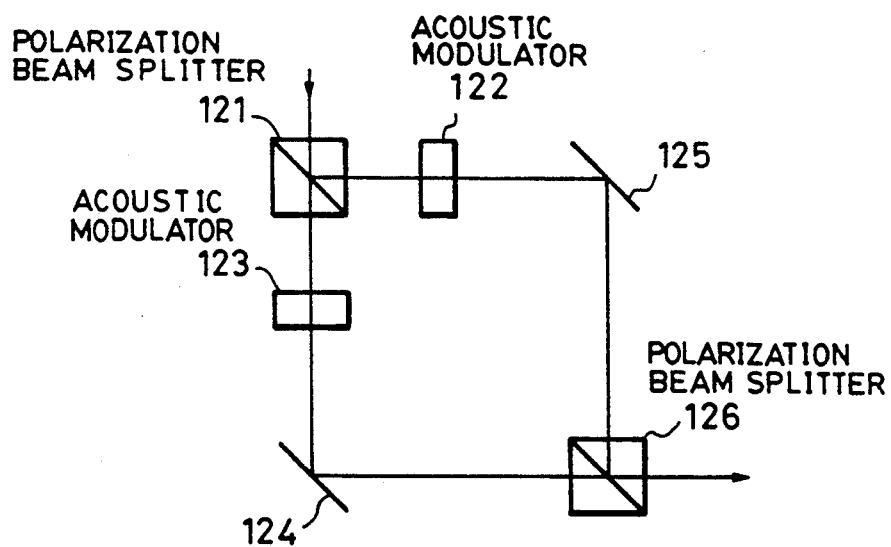
FIG. 9 is a view illustrating the construction of a frequency shifter according to the fourth embodiment.

FIG. 9 shows a specific example of the frequency shifter 71. Reference numerals 121 and 126 denote polarization beam splitters; reference numerals 122 and 123 denote acoustic optical modulators; and reference numerals 124 and 125 denote mirrors. If acoustic optical modulators of 80 and 123 MHz are used as modulators 122 and 123, respectively, a frequency difference of 1 MHz in which polarized states intersect at right angles with each other is obtained between two light beams.

If the deviation of a first brazed grating pattern from a second brazed grating pattern on the basis of the above-described principles in the above manner is determined, the alignment accuracy of a semiconductor exposure apparatus, and an amount of deviation between real element patterns formed by the first and second brazing can be detected.

Figure 10:
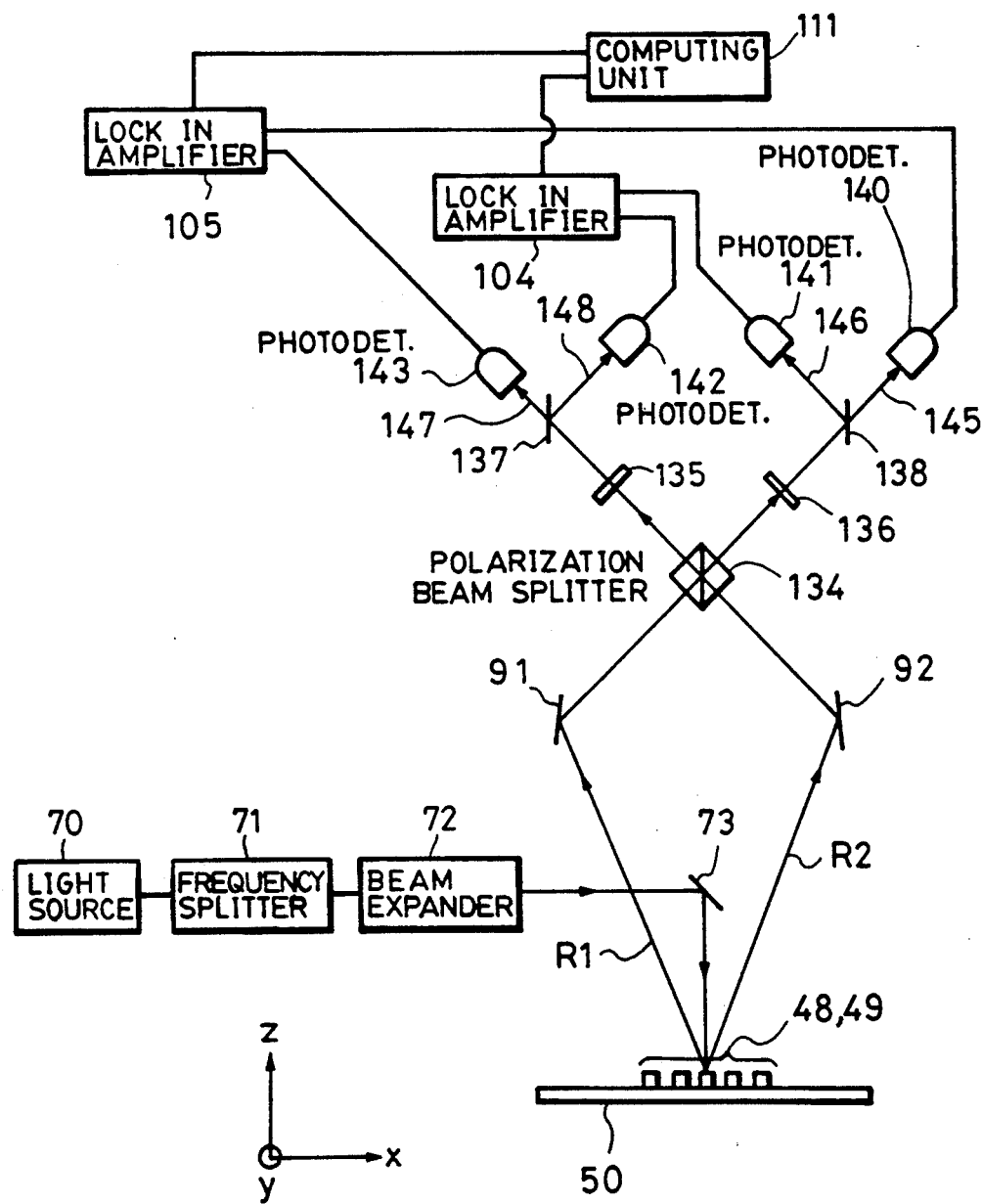
FIG. 10 is a view illustrating a fifth embodiment of the present invention.

FIG. 10 is a view illustrating the fifth embodiment of the present invention. Light beams emitted from the light source 70 are made into light beams $u_1$ (P polarization, frequency $f_1$) and $u_2$ (S polarization, frequency $f_2$) whose frequencies f are slightly different from each other by means of the frequency shifter 71, the polarization planes thereof intersecting at right angles with each other. Complex amplitude displays of the light beams $u_1$ and $u_2$ can be expressed as in the following equations below if $\phi_1$ and $\phi_2$ denote initial phases, $C_{10}$ and $C_{20}$ denote amplitudes, $w_1$ and $w_2$ denote angular frequencies, and $w_1=2\pi f_1$ and $w_2=2\pi f_2$:

$$u_1=C_{10}\cdot exp\{i(w_1t+\phi_1)\} \quad (61)$$

$$u_2=C_{20}\cdot exp\{i(w_2t+\phi_2)\} \quad (62)$$

The diameters of the two light beams $u_1$ and $u_2$ on a common optical path are condensed by the beam expander 72. The direction of travel thereof is changed by the mirror 73 and made to perpendicularly enter the linear diffraction grating 48 and 49 on the wafer 50.

In FIG. 10, when the deviation of the diffraction gratings 48 and 49 from a reference position are denoted as $x_B$ and $x_C$, respectively, phases $2\pi x_B/P$ and $2\pi x_C/P$ with P as the pitch of the grating are added to the +first-order diffracted light beams $u_{1B}(1)$ and $u_{2B}(1)$ (diffracted light beams of $u_1$ and $u_2$, respectively) from the diffraction grating 48, and +first-order diffracted light beams $u_{1C}(1)$ and $u_{2C}(1)$ (diffracted light beams of $u_1$ and $u_2$, respectively) from the diffraction grating 49, indicated by an optical path R1. The complex amplitudes thereof are expressed as follows:

$$u_{1B}(1)=C_{1B}\,exp\{i(w_1t+\phi_1+\phi_B)\} \quad (63)\text{-}1$$

$$u_{2B}(1)=C_{2B}\,exp\{i(w_2t+\phi_2+\phi_B)\} \quad (63)\text{-}2$$

$$u_{1C}(1)=C_{1C}\,exp\{i(w_1t+\phi_1+\phi_C)\} \quad (63)\text{-}3$$

$$u_{2C}(1)=C_{2C}\,exp\{i(w_2t+\phi_2+\phi_C)\} \quad (63)\text{-}4$$

where $u_{1B}$, $u_{2B}$, $u_{1C}$, and $u_{2C}$ are amplitudes, $\phi_B=2\pi X_B/P$ and $\phi_C=2\pi X_C/P$. In FIG. 10, complex amplitudes of −first-order diffracted light beams $u_{1B}(-1)$ and $u_{2B}(-1)$ (diffracted light beams of $u_1$ and $u_2$, respectively) from the diffraction grating 48, and −first-order diffracted light beams $u_{1C}(-1)$ and $u_{2C}(-1)$ (diffracted light beams of $u_1$ and $u_2$, respectively) from the diffraction grating 49, indicated by an optical path $R_2$, are expressed as follows:

$$u_{1B}(-1)=C_{1B}\,exp\{i(w_1t+\phi_1-\phi_B)\} \quad (64)\text{-}1$$

$$u_{2B}(-1)=C_{2B}\,exp\{i(w_2t+\phi_2-\phi_B)\} \quad (64)\text{-}2$$

$$u_{1C}(-1)=C_{1C}\,exp\{i(w_1t+\phi_1-\phi_C)\} \quad (64)\text{-}3$$

$$u_{2C}(-1)=C_{2C}\,exp\{i(w_2t+\phi_2-\phi_C)\} \quad (64)\text{-}4$$

±First-order diffracted light beams are deflected by mirrors 91 and 92 respectively and made to enter a polarization beam splitter 134. Light beams $u_{1B}(1)$, $u_{1C}(1)$, $u_{1B}(-1)$, and $u_{1C}(-1)$ of P polarization are transmitted through the polarization beam splitter 134. Light beams $u_{2B}(1)$, $u_{2C}(1)$, $u_{2B}(-1)$, and $u_{2C}(-1)$ of S polarization are reflected by the polarization beam splitter 134. Thereafter, the polarization planes thereof are aligned by Glan-Thompson prisms 135 and 136 and made to interfere with each other. Of the light beams emerging from the Glan-Thompson prism 135, the intensity change $V_{BL}$ of the interference light beams of light diffracted by the diffraction grating 48 and the intensity change $V_{CL}$ of the interference light beams of light diffracted by the diffraction grating 49 are respectively as follows:

$$V_{BL}=|u_{1B}(-1)+u_{2B}(1)|^2=C^2_{1B}+C^2_{2B}+2C_{1B}C_{2B}\cos\{(w_2-w_1)t+(\phi_2-\phi_1)+2\phi_B\} \quad (65)$$

$$V_{CL}=|u_{1C}(-1)+u_{2C}(1)|^2=C^2_{1C}+C^2_{2C}+2C_{1C}C_{2C}\cos\{(w_2-w_1)t+(\phi_2-\phi_1)+2\phi_C\} \quad (66)$$

Of the light beams emerging from the Glan-Thompson prism 136, the intensity change $V_{BR}$ of the interference light beam of light diffracted by the diffraction grating 48, and the intensity change $V_{CR}$ of the interference light beam of the light diffracted by the diffraction grating 49, are:

$$V_{BR}=|u_{1B}(1)+u_{2B}(-1)|^2=C^2_{1B}+C^2_{2B}+2C_{1B}C_{2B}\cos\{(w_2-w_1)t+(\phi_2-\phi_1)+2\phi_B\} \quad (67)$$

$$V_{CR}=|u_{1C}(1)+u_{2C}(-1)|^2=C^2_{1C}+C^2_{2C}+2C_{1C}C_{2C}\cos\{(w_2-w_1)t+(\phi_2-\phi_1)+2\phi_C\} \quad (68)$$

Furthermore, the light beams are spatially separated by mirrors 137 and 138 into interference light beams 145 (shown by equation (65)) and 147 (shown by equation (66)) of diffracted light from the diffraction grating 48, and interference light beams 146 (shown by equation (66)) and 148 (shown by equation (68)) of diffracted light from the diffraction grating 49. The intensity changes of the respective interference light beams are detected by photoelectric converters 140, 143, 141 and 142. The electrical signals are sent to the lock-in amplifiers 105 and 104. At this time, as the initial phase of light can be erased, phase deviations $\Delta T_B$ and $\Delta T_C$ detected by the lock-in amplifiers 105 and 104 are expressed as follows:

$$\Delta T_B = 4\phi_B = 8\pi x_B/P, \quad \Delta T_C = 4\phi_C = 8\pi x_C/P.$$

The deviation is measured by the computing unit 111 on the basis of the above equations as described in the fourth embodiment.

Figure 11:
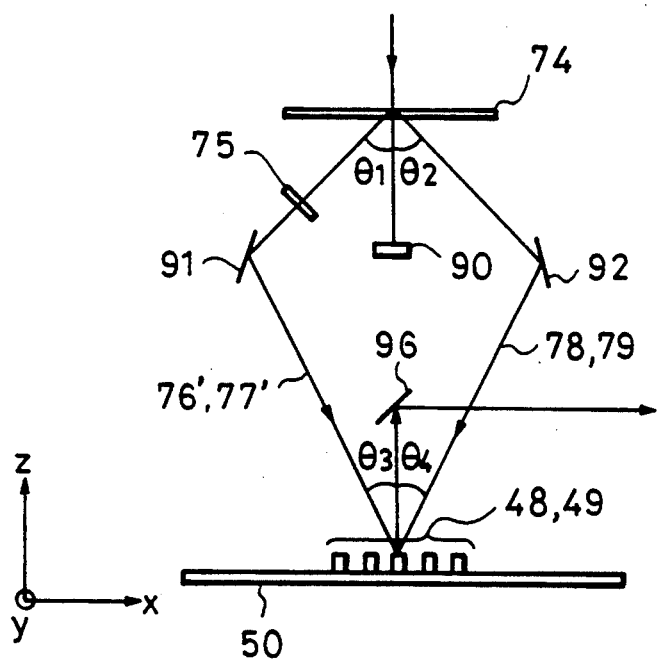
FIG. 11 is a view illustrating a sixth and a seventh embodiment of the present invention.

FIG. 11 is a view illustrating the sixth and seventh embodiments of the present invention. In the sixth embodiment, high-order diffracted light ($\pm$m-th order: m=2, 3, 4 ...) is used, whereas a case in which a deviation is detected by using $\pm$first-order diffracted light from the diffraction gratings 74, 48 and 49 is used, has been shown in the fourth and fifth embodiments.

In FIG. 11, if the pitches of the diffraction gratings 74, 48 and 49 are set at P=2 $\mu$m, the wavelength of the light from light source 70 (not shown) is set at $\lambda=0.6328$ $\mu$m, since the diffraction angles $\theta_1$ and $\theta_2$ of +second-order diffracted light and −second-order diffracted light when the light enters the diffraction grating 74 perpendicularly. Then, $\theta_1 = \theta_2 = \sin(2 \times 0.6328/2) = 39.3°$ on the basis of equation (60). To cause light which has entered the diffraction gratings 48 and 49 to be diffracted upward perpendicular from the wafer 50, the mirrors 91 and 92 should be set so that incident angles $\theta_3$ and $\theta_4$ of the light beams 76', 77', 78 and 79 with respect to the diffraction gratings 48 and 49 are equal to $\theta_1$ ($\theta_2$). In similar manner, the incident angle should be set for $\pm$third-order diffracted light in such a way that $\theta\pm3 = \sin(3 \times 0.6328/2) = 71.7°$.

When $\pm$m-th-order diffracted light is used, phase terms $\phi_{Am}$, $\phi_{Bm}$ and $\phi_{Cm}$ corresponding to $\phi_A$, $\phi_B$ and $\phi_C$ in equations (56) to (59) are expressed as follows:

$$\phi_{Am} = 2m\pi x_A/P \tag{69}$$

$$\phi_{Bm} = 2m\pi x_B/P \tag{70}$$

$$\phi_{Cm} = 2m\pi x_C/P \tag{71}$$

where $x_A$, $x_B$, and $x_C$ denote a deviation of diffraction gratings 74, 48 and 49, respectively, along the x orientation from the same reference.

Therefore, if the deviations of the diffraction gratings 48 and 49 relative to the diffraction grating 74 are expressed in terms of a phase amount, it follows that:

$$4(\phi_{Bm} + \phi_{Am}) = \frac{8m\pi}{P}(X_B + X_A) \tag{72}$$

$$4(\phi_{Cm} + \phi_{Am}) = \frac{8m\pi}{P}(X_C + X_A) \tag{73}$$

Therefore, if high-order diffracted light is used for measurements, a phase amount indicating the deviation of a diffraction grating along the x orientation can be determined with a higher degree of sensitivity. For example, if $\pm$m-th-order diffracted light is used for measurements, sensitivity is increased m times more than when $\pm$first-order diffracted light is used.

In FIG. 11, in the fourth and sixth embodiments, light beams 76' and 77' are irradiated from the left, and light beams 78 and 79 are irradiated from the right, onto the entire surface of the diffraction gratings 48 and 49 at the same incident angle ($\theta_3 = \theta_4$). Diffracted light beams whose absolute values or order are the same (e.g., +m-th order and −m-th order, m=1, 2, 3 ... ) are made to interfere with each other and are used for measurements. In the seventh embodiment, the incident angles of light beams 76' and 77', and light beams 78 and 79 with respect to the diffraction gratings 48 and 49, are adjusted by varying the angles of the mirrors 91 and 92. Diffracted light beams whose absolute values are of different orders (e.g., +m-th order and −n-th order, m=1, 2, 3 ..., n=1, 2, 3 ..., $|m| \neq |n|$) may be made to interfere with each other and the deviation is detected.

In FIG. 11, the mirrors 91 and 92 are adjusted so that +m-th order diffracted light beams of the light beams 76' and 77' with respect to the diffraction gratings 48 and 49 and −n-th order diffracted light beams of the light beams 78 and 79 with respect to diffraction gratings 48 and 49 are diffracted upward perpendicular from the wafer 50, and incident angles $\theta_3$ and $\theta_4$ with respect to the diffraction gratings 48 and 49 are determined. At this time, if $\pm$1-th order light beams are used for the diffracted light of the diffraction grating 74, the following relation is satisfied with the phase term corresponding to $\phi_A$ in equations (48) to (55) as $\phi_{A1}$:

$$\phi_{A1} = 2 1\pi x_A/P \tag{74}$$

If $\phi_B$ in equations (48) and (49) is denoted by $\phi_{Bm}$, and if $\phi_B$ in equations (50) and (51) is denoted by $\phi_{Bn}$, the following relations are satisfied:

$$\phi_{Bm} = 2m\pi x_B/P \tag{75}$$

$$\phi_{Bn} = 2n\pi x_B/P \tag{76}$$

Furthermore, if $\phi_C$ in equations (48) and (49) is denoted by $\phi_{Cm}$, and if $\phi_C$ in equations (50) and (51) is denoted by $\phi_{Cn}$, the following relations are satisfied:

$$\phi_{Cm} = 2m\pi x_C/P \tag{77}$$

$$\phi_{Cn} = 2n\pi x_C/P \tag{78}$$

At this time, intensity changes $V'_{BP}$, $V'_{BS}$, $V'_{CP}$ and $V'_{CS}$ of interference light beams 107, 108, 109 and 110 in FIG. 8 are expressed as follows:

$$V'_{BP} = C^2_1 + C^2_2 + 2C_1C_2 \cos\{(w_2 - w_1)t + (\phi_2\phi_1) + (\phi_{Bm} + \phi_{Bn}) + 2\phi_{A1}\} \tag{79}$$

$$V'_{BS} = C^2_1 + C^2_2 + 2C_1C_2 \cos\{(w_2 - w_1)t + (\phi_2\phi_1) - (\phi_{Bm} + \phi_{Bn}) - 2\phi_{A1}\} \tag{80}$$

$$V'_{CP} = C^2_1 + C^2_2 + 2C_1C_2 \cos\{(w_2 - w_1)t + (\phi_2 - \phi_1) + (\phi_{Cm} + \phi_{Cn}) + 2\phi_{A1}\} \tag{81}$$

$$V'_{CS} = C^2_1 + C^2_2 + 2C_1C_2 \cos\{(w_2 - w_1)t + (\phi_2 - \phi_1) - (\phi_{Cm} + \phi_{Cn}) - 2\phi_{A1}\} \tag{82}$$

Therefore, if the deviation of the diffraction gratings 48 and 49 with respect to the diffraction grating 74 is represented in terms of a phase amount, it follows that:

$$2(\phi_{Bm} + \phi_{Bn}) - 4\phi_{A1} = \frac{8\pi}{P}\{(m+n)X_B + 1X_A)\} \tag{83}$$

$$2(\phi_{Cm} + \phi_{Cn}) - 4\phi_{A1} = \frac{8\pi}{P}\{(m+n)X_C + 1X_A)\} \tag{84}$$

The subtraction of the right side of equation (83) from the right side of equation (84) yields the following:

$$\frac{4\pi(m+n)}{p} \cdot (X_B - X_C) \tag{85}$$

Therefore, a relative deviation between the diffraction gratings 48 and 49 along the x orientation can be determined by equation (85) on the basis of the difference between the phase amounts detected by the lock-in amplifiers 104 and 105.

Figure 12:
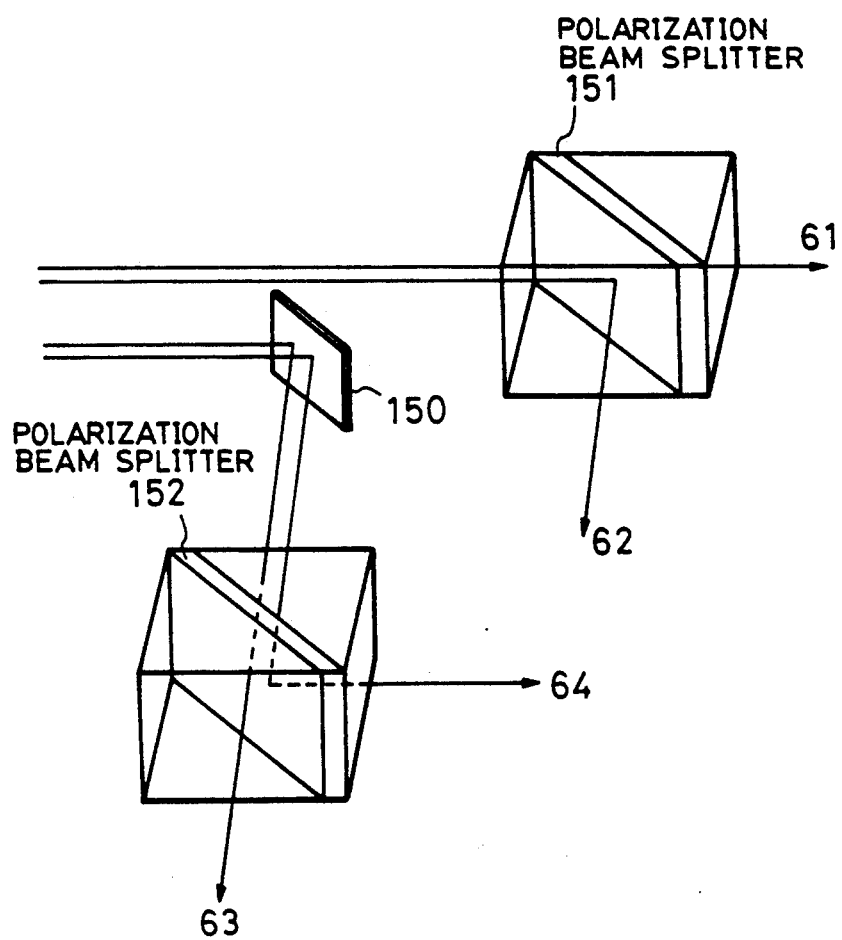
FIG. 12 is a view illustrating an eighth embodiment of the present invention.

FIG. 12 shows the eighth embodiment of the present invention. In the third embodiment, to separate interference light beams 61, 62, 63 and 64, as shown in FIG. 7, a light beam is made to enter the polarization beam splitter 52 first. After the light beam is divided in two: (a) P polarized light beams 61 and 63, and (b) S polarized light beams 62 and 64, the light beams are separated by means of the edge mirror 53 (54) into interference light beam 61 (62) by light diffracted by the diffraction grating 48 and interference light beam 63 (64) by light diffracted by the diffraction grating 49. In this embodiment, as shown in FIG. 12, after the light beams are divided in two by means of a mirror 150: (a) interference light beams 61 and 62 formed by light beams diffracted by the diffraction grating 48, and (b) interference light beams 63 and 64 formed by light beams diffracted by the diffraction grating 49. The light beams are separated into P polarized light beams 61 (63) and S polarized light beams 62 (64) by means of a polarization beam splitter 151 (152).

Figure 13:
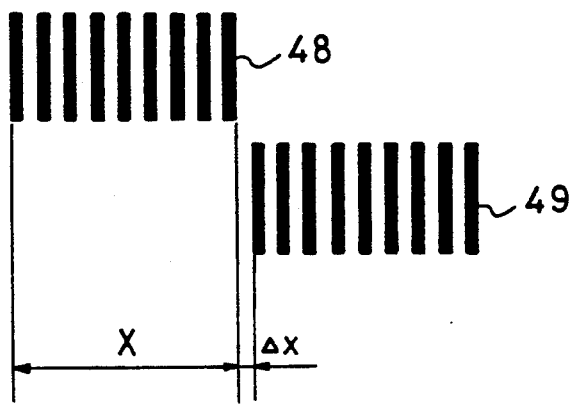
FIG. 13 is a view illustrating a ninth embodiment of the present invention.
Figure 14:
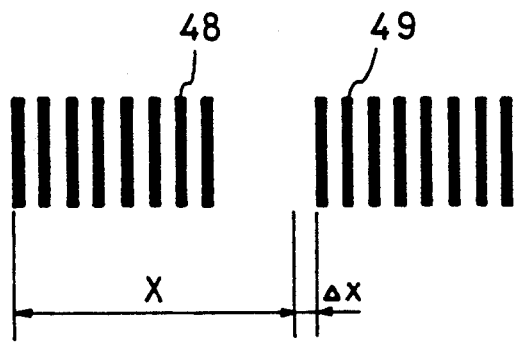
FIG. 14 is a view illustrating a tenth embodiment of the present invention.

FIGS. 13 and 14 are views illustrating the ninth and tenth embodiments of the present invention, respectively. There is no offset of a pattern central position, in a direction in which a positional offset is detected, between the diffraction gratings 48 and 49 used for the measurements in the third to eighth embodiments. However, in this embodiment, the diffraction gratings 48 and 49 are previously arranged to be offset by a known amount x of the diffraction gratings 48 and 49, and the offset is subtracted to detect the deviation $\Delta x$ of the pattern. FIG. 13 shows a condition in which an offset is set in a direction intersecting at right angles with the direction in which a positional offset is detected. FIG. 14 shows a condition in which an offset is set in only a direction in which a positional offset is detected.

As described above, according to the above-described embodiments, sensitivity can be obtained which is approximately two times greater than with a measuring method using a heterodyne interference method with beat signals whose phases are fixed as a reference.

A measuring apparatus of the embodiments which will now be described includes a light-beam forming unit for forming a first pair of beams having different frequencies and a second pair of beams having different frequencies which are combined in such a manner as to generate beat signals having the same frequency; an irradiation unit for irradiating each of the pairs of beams in such a way that a light beam of one of the pair of beams having a low frequency and a light beam of the other pair of beams having a high frequency of the first and second light beams are diffracted at a first order by means of diffraction unit and that a light beam of one of the pair of beams having a high frequency and a light beam of the other pair of beams having a low frequency are diffracted at a second order whose sign is different from that of the first order by means of the diffraction unit; and displacement information detection unit for obtaining relative displacement information of the diffraction unit by comparing a first beat signal obtained by causing the first pair of diffracted beams to interfere with each other with a second beat signal obtained by causing the second pair of diffracted beams to interfere with each other.

Figure 15:
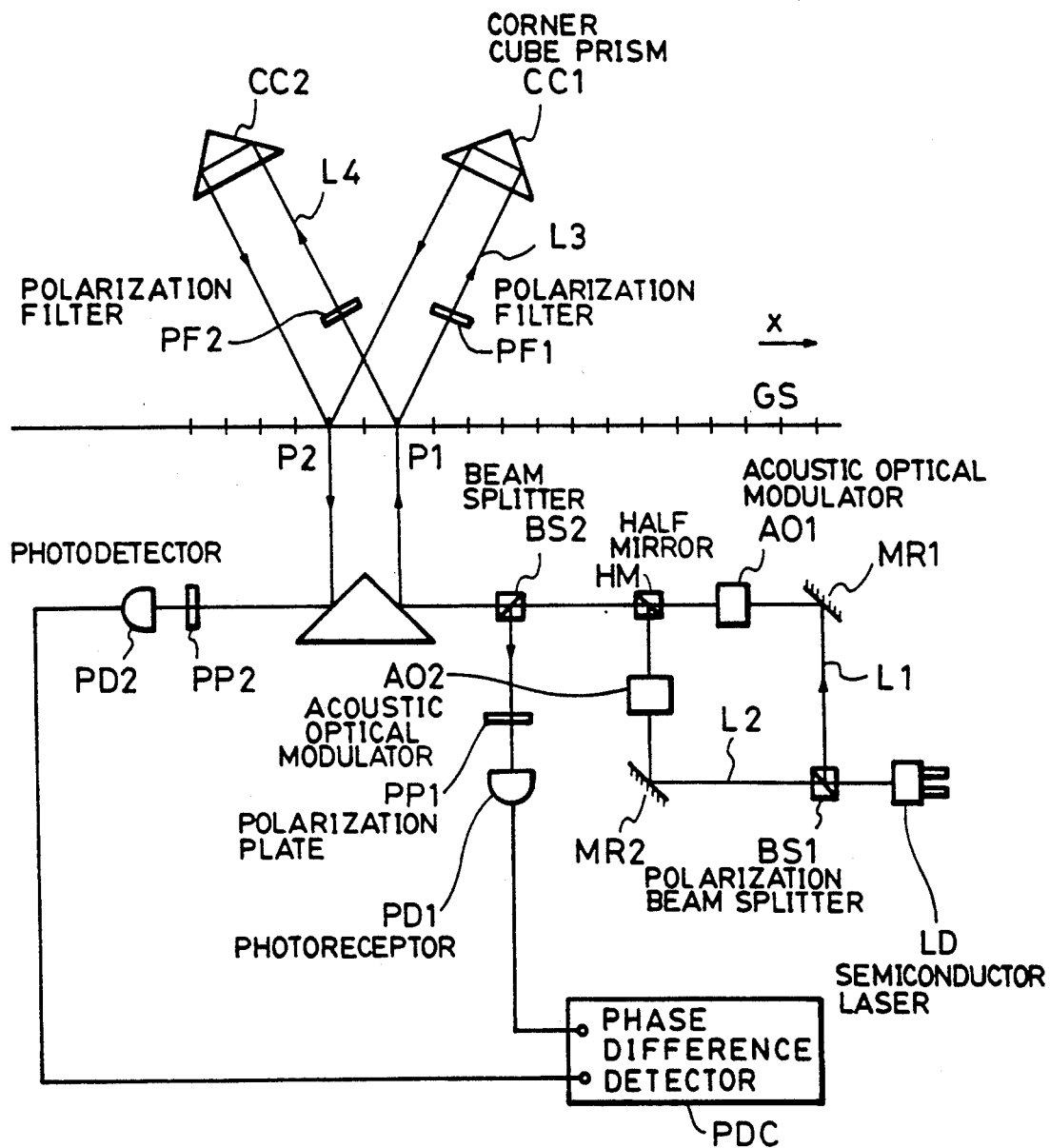
FIG. 15 is a schematic view of an apparatus using the technology which is a prerequisite for subsequent embodiments of the present invention.

Before the embodiments are explained, the technology which is a prerequisite for subsequent embodiments will be described below with reference to FIG. 15. FIG. 15 is a schematic view of a length measuring apparatus using the prerequisite technology.

In FIG. 15, first a monochromatic light beam from a semiconductor laser LD is divided into two light beams L1 and L2 by a polarization beam splitter BS1. The light beams L1 and L2 are made to enter acoustic optical modulators AO1 and AO2, respectively. Frequencies $f_1$ and $f_2$ of outgoing light beams whose polarization planes are tilted by 90° relative to each other are shifted so that the frequencies differ to an extent that the beat signals thereof can be electrically observed. The light beams are merged by a half mirror HM.

A part of this merged light beam is extracted by a beam splitter BS2, and an optical heterodyne signal is obtained as a reference signal by a photoreceptor element PD1. A polarization plate PP1 whose polarization orientation is tilted by 45° is inserted at a location before the PD1 to cause the polarization planes of the two light beams to be aligned and to cause the light beams to interfere with each other at that time.

When the remaining light beam divided by BS2 enters the diffraction grating GS perpendicularly and is diffracted, the phase $\delta$ of the diffraction grating GS is added to the diffraction wave front. If it is assumed that the initial phase of an incident beam is 0, the phase beam of the diffracted waves is $\exp\{i(wt+m\delta)\}$, where m is the order of diffraction. For example, the +first-order light beam and −first-order light beam are $\exp\{i(wt+m\delta)\}$ and $\exp\{i(wt-m\delta)\}$, respectively. To extract light beams only of frequency $f_1$ for +first-order light beam L3 and light beams only of frequency $f_2$ for −first-order light beam L4, polarization filters PF1 and PF2 are disposed inside the optical paths for the light beams L3 and L4, respectively. The light beams L3 and L4 enter corner cube prisms CC1 and CC2, are reflected in a direction parallel and opposite to the incidence direction, respectively, are made to return to a point P2 on the diffraction grating GS, are diffracted a second time at the same order as that of the first diffraction to become one light beam, interfere with each other and enter the photoreceptor element PD2.

There is a phase lead of one wavelength in the phase of the +first-order light beam L3 for a displacement corresponding to one pitch of the diffraction grating GS along the x orientation. There is a phase delay of one wavelength in the phase of the −first-order light beam L4. As these light beams are once more reflected by the corner cube prisms CC1 and CC2 and diffracted at the same order as before, a phase difference for four wavelengths is added to the phases of the two light beams when the light beams are merged.

If a light beam having a frequency $f_1$ is represented by $u_1 = a \exp\{i(w_1 t)\}$, and a light beam having a frequency $f_2$ is represented by $u_2 = b \exp\{i(w_2 t)\}$ (where a, b are constants, t is time, and i is an imaginary unit), an optical heterodyne signal obtained by the photoreceptor element PD1 as a reference signal is expressed as follows:

$$I_{REF} = a^2 + b^2 + 2ab \cos(w_1 - w_2)t$$

Since, in the above equation, $w_1 = 2\pi f_1$ and $w_2 = 2\pi f_2$, this signal is a signal with a frequency corresponding to the difference between $f_1$ and $f_2$. Since the phase $\delta$ of the diffraction grating GS is added to the +first-order light beam L3 each time the light beam L3 is diffracted and finally the +first-order light beam is diffracted two times, the following expression can be made:

$$u'_1 = a' \exp\{i(w_1 t + 2\delta)\}$$

where a' is a constant.
Since the phase $\delta$ of the diffraction grating GS is subtracted from the −first-order light beam L4 each time the light beam L4 is diffracted and finally the −first-order light beam is diffracted two times, a light beam expressed as $$u'_2 = b' \exp\{i(w_2 t + 2\delta)\}$$

(where b' is a constant) is incident on the photoreceptor element PD2. Therefore, an optical heterodyne signal obtained by the photoreceptor element PD2 is expressed as follows:

$$I_{SIG} = a'^2 + b'^2 + 2a'b' \cos\{(w_1 - w_2)t + 4\delta\}$$

The frequency of this signal is the same as that of the reference signal, but the phase of the optical heterodyne signal is out of phase with the reference signal by an amount $4\delta$ proportional to the amount of movement of the diffraction grating GS.

Two optical heterodyne signals obtained by the photoreceptor elements PD1 and PD2 are input to a phase difference detector PDC. The phase difference between the signals is detected to measure the amount of movement of the diffraction grating GS. If the grating constant of the diffraction grating GS is set at 1.6 μm and the amount of movement of diffraction grating GS is denoted as x, the following relation is satisfied:

$$4\delta = 4 \times \frac{2\pi x}{1.6} \text{ [rad]}$$

Therefore, when a phase deviation of one cycle, i.e., $2\pi$ [rad], is detected, it is clear that the diffraction grating GS is moved by 1.6 μm ≈ 4 = 0.4 μm. Detection of an amount of movement with a high degree of resolution is made possible by making the minimum detection phase difference sufficiently smaller than one cycle. If a phase difference detector which is capable of resolving up to, for example, 0.2°, is used, theoretically, a displacement up to 0.22 [nm] can be measured.

Embodiments will be explained below with reference to the accompanying drawings on the basis of the prerequisite technology described above..

Figure 16:
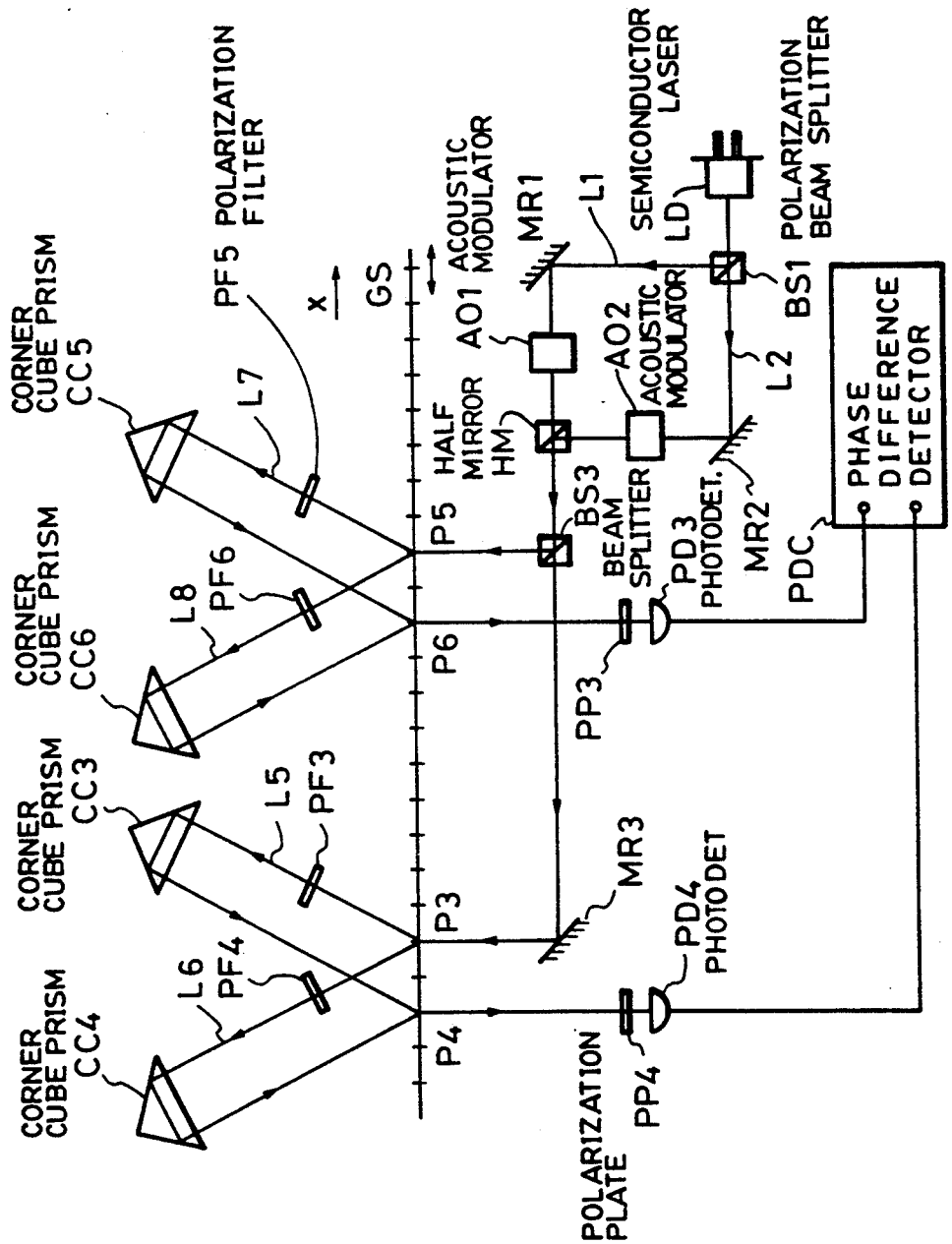
FIG. 16 is a schematic view of a length measuring apparatus of an eleventh embodiment of the present invention.

FIG. 16 is a schematic view of a length measuring apparatus of the eleventh embodiment of the present invention. Components in FIG. 16 which are the same as those shown in FIG. 15 are given the same reference numerals.

In FIG. 16, first a monochromatic light beam from a semiconductor laser LD is divided into two light beams L1 and L2 by the polarization beam splitter BS1. The light beams L1 and L2 are made to enter the acoustic optical modulators AO1 and AO2, respectively. Frequencies $f_1$ and $f_2$ of outgoing light beams whose polarization planes are tilted by 90° relative to each other are shifted so that the frequencies differ to an extent that the beat signals thereof can be electrically observed. The light beams are merged by the half mirror HM.

The merged light beam is divided into two beams by a beam splitter BS3. The transmitted light beam is reflected by a mirror MR3. The beams enter perpendicularly to the diffraction grating GS at points P5 and P3, respectively, and are diffracted. To extract light beams only of frequency f1 for +first-order light beam L7 diffracted at point P5, and light beams only of frequency f2 for −first-order light beam L8, polarization filters PF5 and PF6 are disposed inside the optical paths for the light beams L7 and L8, respectively. Similarly, to extract light beams only of frequency $f_2$ for +first-order light beam L5 diffracted at point P3 and light beams only of frequency $f_1$ for −first-order light beam L6, polarization filters PF3 and PF4 are disposed inside the optical paths for the light beams L5 and L6, respectively. The light beams L7, L8, L5 and L4 enter corner cube prisms CC5, CC6, CC3 and CC4, respectively, are reflected in a direction parallel and opposite to the incidence direction, are made to return to points P6 and P4 on the diffraction grating GS, are diffracted a second time at the same order as that of the first diffraction to become one light beam, interfere with each other and enter the photoreceptor element PD2. The light beams are diffracted a second time at the same order as that of the first diffraction at points P6 and P4. Two light beams are merged at each of these two points to become one light beam. The merged light beam from P6 being made to enter the photoreceptor element PD3, and the merged light beam from P4 being made to enter the photoreceptor element PD4. Polarization plates PP3 and PP4 whose polarization orientations are tilted by 45° to cause the light beams to interfere with each other with their polarization planes aligned are disposed at a location before the photoreceptor element PD3 and PD4, respectively.

There is a phase lead of one wavelength in the phases of the +first-order light beams L7 and L5 for a displacement corresponding to one pitch of the diffraction grating GS along the x orientation. There is a phase delay of one wavelength in the phase of the −first-order light beams L8 and L6. As these light beams are once more reflected by corner cube prisms and diffracted at the same order as before, a phase difference for four wavelengths is added to the phase of the merged light beams L7 and L8 when the light beams are merged again at point P6. Also, a phase difference for four wavelengths is added to the light beams L5 and L6 merged at P4.

If it is assumed that $w_1 = 2\pi f_1$ and $w_2 = 2\pi f_2$, as described above, the light beam L1 is expressed as $u_1 = a \cdot \exp\{i(w_1 t)\}$, and the light beam L2 is expressed as $u_2 = a \cdot \exp\{i(w_2 t)\}$. The phase $\delta$ corresponding to the amount of movement x of diffraction grating GS is expressed as follows with the grating constant of the diffraction grating GS as p:

$$\delta = \frac{2\pi x}{p}$$

Since the phase $\delta$ of the diffraction grating GS is added to the +first-order light beam L7 each time it is diffracted and +first-order diffracted a total of two times, the light beam can be expressed by the following equation when it is incident on the photoreceptor element PD3:

$$u'''_1 = a'' \exp\{i(w_1 t + 2\delta)\}$$

where $a''$ is a constant. Since the phase $\delta$ of the diffraction grating GS is subtracted from the $-$first-order light beam L8 each time it is diffracted and finally the $-$first-order beam is diffracted two times, a light beam expressed as $$u'_2 = b' \exp\{i(w_2 t + 2\delta)\}$$

(where $b'$ is a constant) is incident on the photoreceptor element PD3. Therefore, an optical heterodyne signal obtained by the photoreceptor element PD3 is expressed as follows:

$$I_{PD3} = a''^2 + b'^2 + 2a''b' \cos\{(w_1 - w_2)t + 4\delta\}$$

The frequency of this signal is the same as the difference between $f_1$ and $f_2$. The phase thereof is added because of diffraction by an amount $4\delta$ proportional to the amount of movement of the diffraction grating GS. Since the phase $\delta$ of the diffraction grating GS is added to the $+$first-order light beam L5 each time it is diffracted and the $+$first-order beam is diffracted a total of two times, the following equation can be made when the light beam is incident on the photoreceptor element PD4:

$$u'''_2 = b''' \exp\{i(w_2 t + 2\delta)\}$$

where $b'''$ is a constant. Since the phase $\delta$ of the diffraction grating GS is subtracted from the $-$first-order light beam L6 each time it is diffracted and finally $-$first-order beam is diffracted two times, a light beam expressed as $$u'''_1 = a''' \exp\{i(w_1 t + 2\delta)\}$$

(where $a'''$ is a constant) is incident on the photoreceptor element PD4. Therefore, an optical heterodyne signal obtained by the photoreceptor element PD4 is expressed as follows:

$$I_{PD4} = a'''^2 + b'''^2 + 2a'''b''' \cos\{(w_1 - w_2)t - 4\delta\}$$

The frequency of this signal is the same as that obtained by the photoreceptor element PD3, and an amount $4\delta$ proportional to the amount of movement of the diffraction grating GS is subtracted by diffraction from the phase. Two optical heterodyne signals obtained by the photoreceptor elements PD3 and PD4 are input to the phase difference detector PDC. The phase difference between the signals is detected by the detector PDC to measure the amount of movement of the diffraction grating GS. If the grating constant of the diffraction grating GS is set at 1.6 μm and the amount of movement of diffraction grating GS is denoted as x, the following relation is satisfied:

$$8\delta = 8 \times \frac{2\pi x}{1.6} \text{ [rad]}$$

Therefore, when a phase deviation of one cycle, i.e., $8\delta = 2\pi$ [rad], is detected, it is clear that the diffraction grating GS is moved by 1.6 μm≈8=0.2 μm. This means that the amount of a displacement which can be detected by a phase difference of one cycle is one half that for the above-mentioned apparatus of FIG. 15.

Accordingly, even if a phase difference detector having the same resolution is used, a minimum detection displacement amount of the apparatus of this embodiment is one half that of the apparatus of FIG. 15, and a higher resolution is obtained. The use of the above-mentioned phase difference detector capable of resolving up to 0.2° permits a displacement up to 0.11 [nm] to be measured theoretically.

Figure 17:
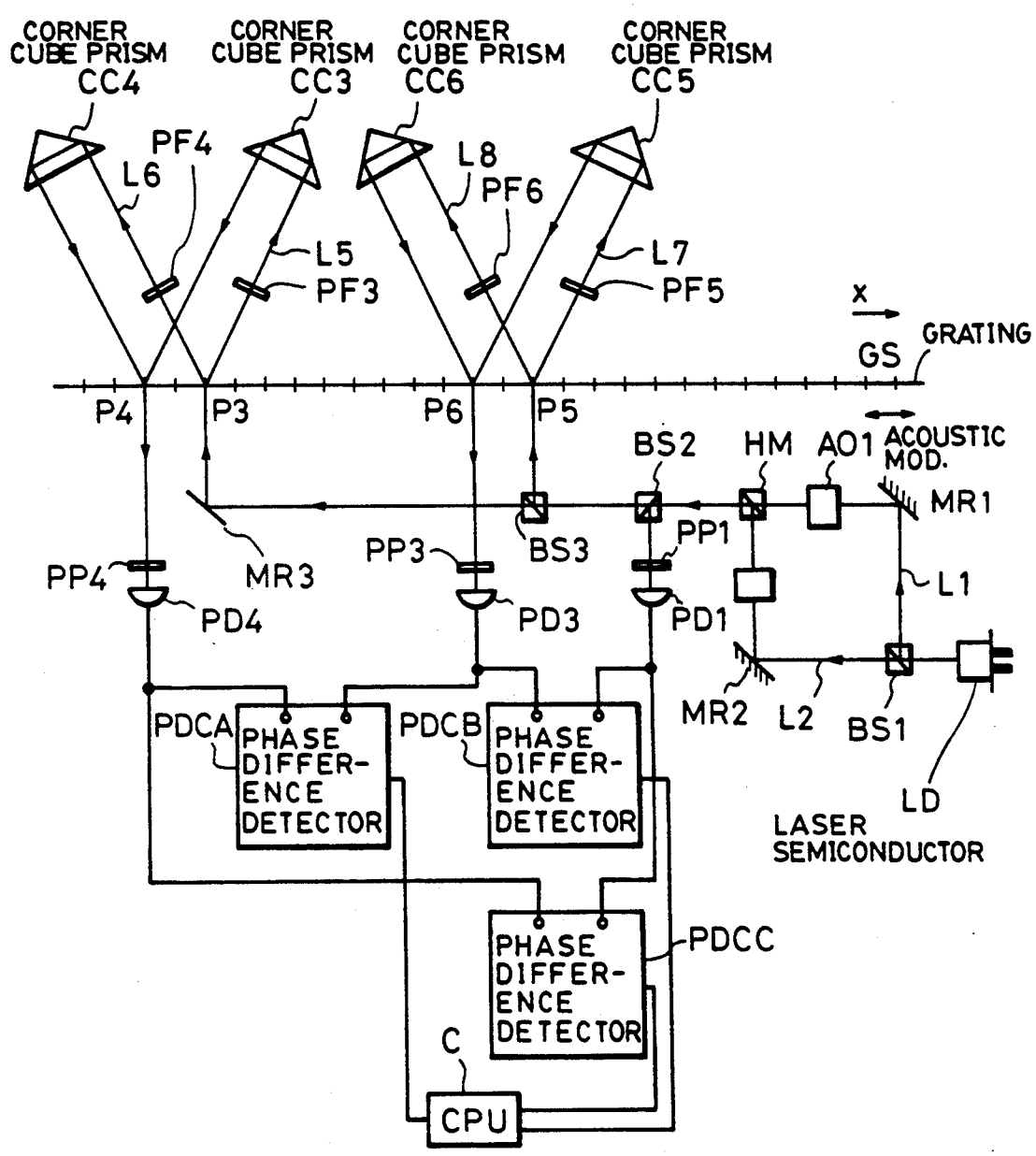
FIG. 17 is a schematic view of a length measuring apparatus of a twelfth embodiment of the present invention.

FIG. 17 shows the twelfth embodiment of the present invention. Although in this embodiment, the optical system around diffraction gratings extracts in the same form as in the eleventh embodiment, a reference signal is extracted and the method of detecting a phase difference is modified. Components which are the same as those described above are given the same reference numerals below.

In FIG. 17, first a monochromatic light beam from the semiconductor laser LD is divided into two light beams L1 and L2 by a polarization beam splitter BS1. The light beams L1 and L2 are made to enter acoustic optical modulators AO1 and AO2, respectively. Frequencies $f_1$ and $f_2$ of outgoing light beams whose polarization planes are tilted by 90° relative to each other are shifted so that the frequencies differ to an extent that the beat signals thereof can be electrically observed. The light beams are merged by the half mirror HM.

A part of this merged light beam is extracted by the beam splitter BS2, and an optical heterodyne signal is obtained as a reference signal by the photoreceptor element PD1. To cause the polarization planes of the two light beams to be aligned and to cause the light beams to be made to interfere with each other at that time, the polarization plate PP1 whose polarization orientation is tilted by 45° is inserted at a location before the PD1.

The remaining light beam divided by BS2 is further divided into two by the beam splitter BS3. The transmitted light beams from beam splitter BS3 are reflected by the mirror MR3, and the transmitted and reflected light beams enter the diffraction grating GS perpendicularly at points P5 and P3, respectively, and are diffracted. To extract light beams only of frequency f1 for $+$first-order light beam L7 diffracted at point P5 and light beams only of frequency $f_2$ for $-$first-order light beam L8, polarization filters PF5 and PF6 are disposed inside the optical paths for the light beams L7 and L8, respectively. Similarly, to extract light beams only of frequency $f_2$ for $+$first-order light beam L5 diffracted at point P3 and light beams only of frequency $f_1$ for $-$first-order light beam L6, polarization filters PF3 and PF4 are disposed inside the optical paths for the light beams L5 and L6, respectively. The light beams L7, L8, L5 and L6 enter corner cube prisms CC5, CC6, CC3 and CC4, respectively, are each reflected in a direction parallel and opposite to the incidence direction, respectively, and are made to return to points P6 and P4 on the diffraction grating GS. The light beams are diffracted at these two points a second time at the same order as that of the first diffraction to become one light beam. The merged light beams from point P6 enter the photoreceptor element PD3, and the merged light beams from point P4 enter the photoreceptor element PD4. To cause the polarization planes of the two merged light beams to be aligned and to cause the light beams to interfere with each other, polarization plates PP3 and PP4 whose polarization orientations are tilted by 45° are inserted at locations before the photoreceptor elements PD3 and PD4, respectively.

There is a phase lead of one wavelength in the phase of the +first-order light beams L7 and L5 for a displacement corresponding to one pitch of the diffraction grating GS along the x orientation. There is a phase delay of one wavelength in the phase of the −first-order light beam L8 and L6. As each of these light beams is reflected by the corner cube prisms and diffracted once more at the same order as before, a phase difference for four wavelengths is added to the phase of the merged light beams L7 and L8 when the light beams are merged at point P6. Also, a phase difference for four wavelengths is added to the phase of the merged light beams L5 and L6 when the light beams are merged at point P4.

As described above, if a light beam having a frequency $f_1$ is represented by $u_1 = a \cdot exp\ \{i\ (w_1 t)\}$, and if a light beam having a frequency $f_2$ is represented by $u_2 = b\ exp\ \{i\ (w_2 t)\}$, an optical heterodyne signal obtained by the photoreceptor element PD1 as a reference signal is expressed as follows:

$$I_{REF} = a^2 + b^2 + 2ab\ \cos\ (w_1 - w_2)\ t.$$

Since, in the above equation, $w_1 = 2\pi\ f_1$ and $w_2 = 2\pi\ f_2$, this signal is a signal having a frequency corresponding to the difference between $f_1$ and $f_2$. The phase $\delta$ of the diffraction grating GS corresponding to the amount x of movement of the diffraction grating GS is expressed as follows, as was previously mentioned:

$$\delta = \frac{2\pi x}{P}$$

Since the phase $\delta$ of the diffraction grating GS is added to the +first-order light beam L7 each time it is diffracted and the finally +first-order diffracted beam is diffracted two times, the following expression can be made when the light beam is incident on the photoreceptor element PD3:

$$u''_1 = a''\ exp\ \{i\ (w_1 t + 2\delta)\}.$$

Since the phase $\delta$ of the diffraction grating GS is subtracted from the −first-order light beam L8 each time it is diffracted and the finally −first-order diffracted beam is diffracted two times, a light beam expressed as $$u''_2 = b''\ exp\ \{i\ (w_2 t - 2\delta)\}$$

is incident on the photoreceptor element PD3. Therefore, an optical heterodyne signal obtained by the photoreceptor element PD3 is expressed as follows:

$$I_{PD3} = a''^2 + b''^2 + 2a''b''\ \cos\ \{(w_1 - w_2)\ t + 4\delta\}.$$

The frequency of this signal is the same as that of the reference signal. The phase thereof leads that of the reference signal, by an amount $4\delta$ proportional to the amount of movement of the diffraction grating GS. Since the phase $\delta$ of the diffraction grating GS is added to the +first-order light beam L5 each time it is diffracted and the finally +first-order diffracted beam is diffracted two times, the following expression can be made when the light beam is incident on the photoreceptor element PD4:

$$u'''_2 = b'''\ exp\ \{i\ (w_2 t + 2\delta)\}$$

Since the phase $\delta$ of the diffraction grating GS is subtracted from the −first-order light beam L6 each time it is diffracted and the finally −first-order diffracted beam is diffracted two times, a light beam expressed as $$u'''_1 = a'''\ exp\ \{i\ (w_1 t - 2\delta)\}$$

is incident on the photoreceptor element PD4. Therefore, an optical heterodyne signal obtained by the photoreceptor element PD4 is expressed as follows:

$$I_{PD4} = a'''^2 + b'''^2 + 2a'''b'''\ \cos\ \{(w_1 - w_2)\ t - 4\delta\}$$

The frequency of this signal is the same as that of the reference signal, and the phase thereof is delayed with respect to that of the reference signal by an amount $4\delta$ proportional to the amount of movement of the diffraction grating GS. Two optical heterodyne signals obtained by the photoreceptor elements PD3 and PD4 are input to the phase difference detector PDCA. The phase difference between the signals is detected by the detector PDCA to measure the amount of movement of the diffraction grating GS. If the grating constant of the diffraction grating GS is set at 1.6 μm and the amount of movement of diffraction grating GS is denoted as x, the following relation is satisfied:

$$8\delta = 8 \times \frac{2\pi x}{1.6}\ [rad]$$

Therefore, when a phase deviation of $8\delta = 2\pi$ [rad] is detected, it is clear that the diffraction grating GS is moved by 1.6 μm≈8=0.2 μm. This is the same as in the first embodiment. The use of the above-mentioned phase difference detector capable of resolving up to 0.2° permits a displacement up to 0.11 [nm] to be measured theoretically. In this embodiment, the output from the detector PDCA is input to a central processing unit (CPU) C, whereby the signals are processed and an amount of displacement is computed.

Photoreceptor elements PD1 and PD3 detect a phase difference in a phase difference detector PDCB in the same manner as above and compare a phase difference obtained by a phase difference detector PDCC from the photoreceptor elements PD1 and PD4. At that time, when there is a temperature difference between two optical paths because of, for example, air disturbance, though the absolute values of the two phase differences are equal, being $4\delta$, these two phase differences are not equal. Therefore, when a difference between these phase differences is detected by the CPU, it is detected that the measured value is erroneous. When a difference between these phase differences exceeds an allowable value, erroneous inputting of a measured value can be prevented by the CPU performing the following: (1) sending a command signal to an unillustrated actuator in order to stop a fine movement of the diffraction grating, that is, the measurement is temporarily stopped, or (2) erasing a signal from the phase difference detector PDCA at that time.

Figure 18:
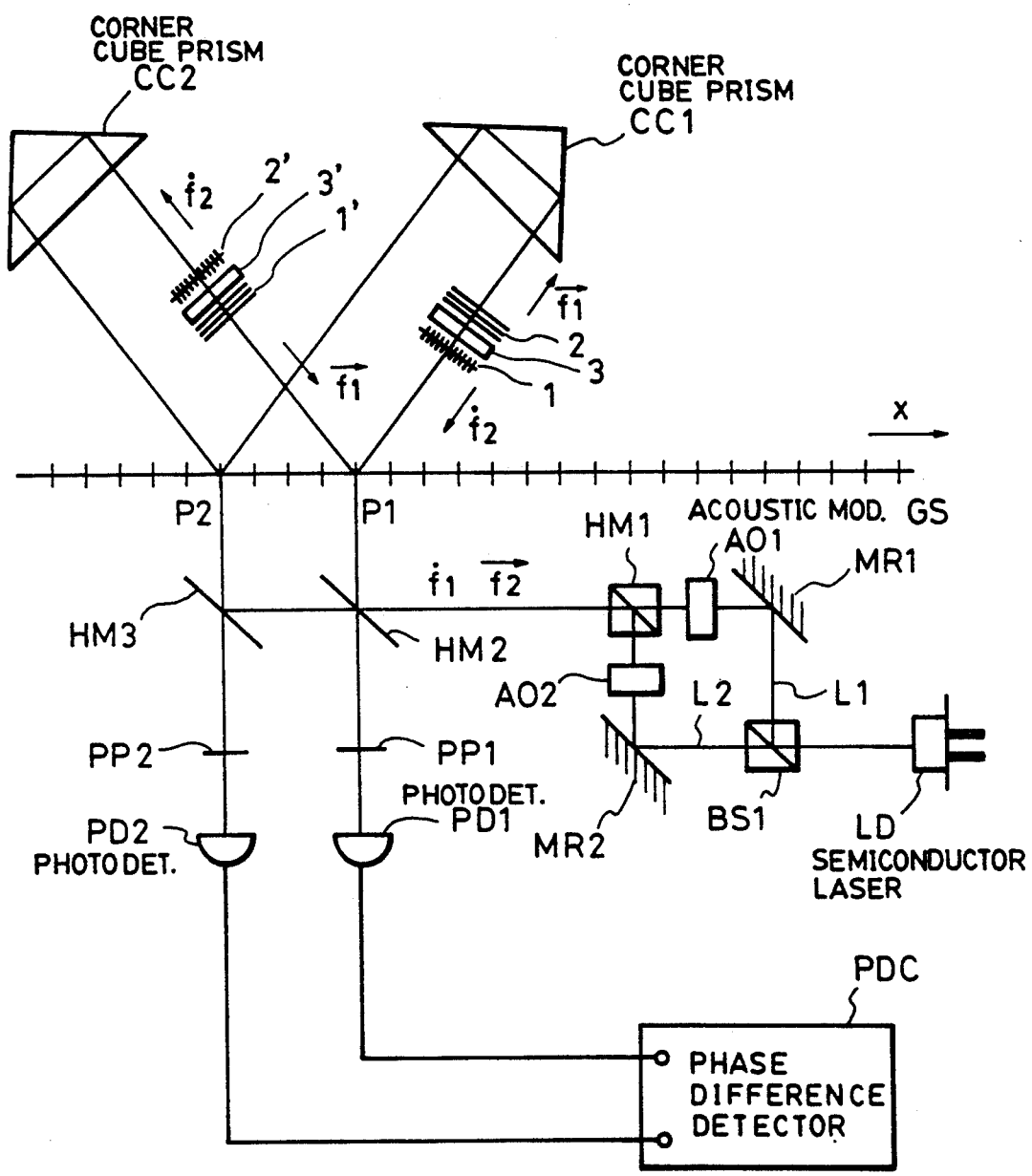
FIG. 18 is a schematic view of a length measuring apparatus of a thirteenth embodiment of the present invention.

FIG. 18 shows the thirteenth embodiment of the present invention, in which the construction of the apparatus shown in FIG. 18 is simplified by providing one optical path, whereas previous embodiments have two similar optical paths.

In FIG. 18, first a monochromatic light beam from the semiconductor laser LD is divided into two light beams L1 and L2 by the polarization beam splitter BS1. The light beams L1 and L2 are made to enter acoustic optical modulators AO1 and AO2, respectively. Frequencies $f_1$ and $f_2$ of the outgoing light beams whose polarization planes are tilted by 90° relative to each other are shifted so that the frequencies differ to an extent that the beat signals thereof can be electrically observed. The light beams are merged by the half mirror HM1.

This merged light beam is divided into two by a half mirror HM2. One light beam is made to enter the diffraction grating GS at point P1. The +first-order diffracted light beam path through an optical system formed by two polarization plates 1P and 2P shown in FIG. 19, whose polarization directions intersect at right angles with respect to each other, and a λ/2 plate 3P. Only the S-polarized diffracted light beams having frequency $f_1$ are converted into P-polarized light beams, are made to enter the corner cube prism CC1, are reflected and are made to enter point P2 on the diffraction grating GS. In contrast, −first-order diffracted light beams are made to enter an optical system such as the optical system shown in FIG. 19 tilted axially by 90° (i.e., the optical system formed of polarization plates 1P' and 2P', and a λ/2 plate 3P'). Only the P-polarized diffracted light beams having frequency $f_2$ are converted into S-polarized light beams, made to enter the corner cube prism CC2, reflected and made to enter point P2 on the diffraction grating GS. The two light beams which have entered the point P2 are diffracted a second time at the same order as at the first time, are merged and transmitted through the half mirror HM3 as one light beam, and enter the photoelectric conversion element PD2. To cause the polarization planes of the two light beams to be aligned and to cause the light beams to interfere with each other, a polarization plate PP2 whose polarization orientation is tilted by 45° is inserted at a location before the PD2. There is a phase lead of one wavelength in the phase of the +first-order light beam for a displacement corresponding to one pitch of the diffraction grating GS along the x orientation. There is a phase lag of one wavelength in the phase of the −first-order light beam. As these light beams are reflected by the corner cube prisms and diffracted once more at the same order as before, a phase difference for four wavelengths are added to the light beams having a frequencies $f_1$ and $f_2$ when the light beams are merged at point P2.

Figure 19:
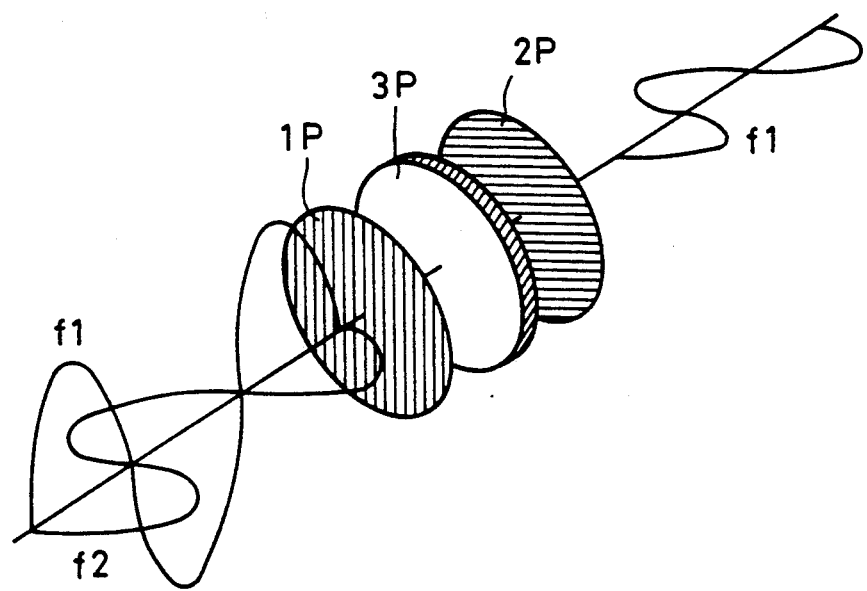
FIG. 19 is a view illustrating the optical system of a part of the thirteenth embodiment of the present invention.

The remaining light beams which have been transmitted through the half mirror HM2 are reflected by the half mirror HM3, and made to enter the diffraction grating GS at point P2. The +first-order diffracted light beams are made to enter the corner cube prism CC1, then pass through the optical system such that the optical system shown in FIG. 19 is tilted axially by 90° in a direction opposite to the previous case. The P-polarized diffracted light beams only having a frequency $f_2$ are converted into S-polarized light beams and made to enter the diffraction grating GS at point P2. In contrast, the −first-order diffracted light beams are made to enter the optical system shown in FIG. 19 in a direction opposite to the previous case. The S-polarized diffracted light beams only having a frequency $f_1$ are converted into P-polarized light beams and made to enter the diffraction grating GS at point P1. The two light beams which have entered point P1 are diffracted again and merged. The light beams are transmitted through the half mirror HM2 as one light beam and made to enter the photoelectric conversion element PD1. To cause the polarization planes of the light beams to be aligned and to cause the light beams to interfere with each other, a polarization plate PP1 whose polarization orientation is tilted by 45° is inserted at a location before the PD1.

There is a phase lead of one wavelength in the phase of the +first-order light beams for a displacement corresponding to one pitch of the diffraction grating GS along the x orientation. There is a phase delay of one wavelength in the phase of the −first-order light beams. As these light beams are reflected by the corner cube prisms and diffracted once more at the same order as before, a phase difference for four wavelengths is added to the phase of the merged light beams when the light beams are merged at point P1.

As described above, the light beam having a frequency $f_1$ is expressed as $u_1 = a \cdot exp\{i(w_1 t)\}$, and the light beam having a frequency $f_2$ is expressed as $u_2 = a \cdot exp\{i(w_2 t)\}$. Since, in the above equation, $w_1 = 2\pi f_1$ and $w_2 = 2\pi f_2$, the merged light beams form a beat signal with a frequency corresponding to the difference between $f_1$ and $f_2$. The phase δ corresponding to the amount of movement x of diffraction grating GS is expressed as follows with the grating constant of the diffraction grating GS as p:

$$\delta = \frac{2\pi x}{p}$$

Since the phase δ of the diffraction grating GS is added to the +first-order light beam diffracted at point P1 having a frequency $f_1$ each time it is diffracted and the finally +first-order diffracted beam is diffracted two times, the following expression can be made when the light beam is incident on the photoreceptor element PD2:

$$u''_1 = a'' \cdot exp\{i(w_1 t + 2\delta)\}.$$

Since the phase δ of the diffraction grating GS is subtracted from the −first-order light beam diffracted at point P1 having a frequency $f_2$ each time it is diffracted and finally −first-order diffracted beam is diffracted two times, a light beam expressed as $$u''_2 = b'' \cdot exp\{i(w_2 t = 2\delta)\}$$

is incident on the photoreceptor element PD2. Therefore, an optical heterodyne signal obtained by the photoreceptor element PD2 is expressed as follows:

$$I_{PD2} = a''^2 + b''^2 + 2a''b'' \cos\{(w_1 - w_2)t + 4\delta\}$$

The frequency of this signal is the same as the difference between $f_1$ and $f_2$. The phase thereof leads by an amount 4δ proportional to the amount of movement of the diffraction grating GS in comparison with a case before the light beam is made to enter the diffraction grating GS. Since the phase δ of the diffraction grating GS is added to the +first-order light beam, diffracted at point P2, having a frequency $f_2$ each time it is diffracted and the finally +first-order diffracted beam is diffracted two times, the following equation can be made when the light beam is incident on the photoreceptor element PD1:

$$u'''_2 = b''' \exp\{i(w_2 t + 2\delta)\}.$$

Since the phase $\delta$ of the diffraction grating GS is subtracted from the $-$first-order light beam, diffracted at point P2, having a frequency $f_1$ each time it is diffracted and the finally $-$first-order diffracted beam is diffracted two times, a light beam expressed as $$u'''_1 = a''' \exp\{i(w_1 t - 2\delta)\}$$

is incident on the photoreceptor element PD1. Therefore, an optical heterodyne signal obtained by the photoreceptor element PD1 is expressed as follows:

$$I_{PD1} = a'''^2 + b'''^2 + 2a'''b''' \cos\{(w_1 w_2)t - 4\delta\}$$

The frequency of this signal is also equal to the difference between $f_1$ and $f_2$. The phase thereof is delayed by an amount $4\delta$ proportional to the amount of movement of the diffraction grating GS in comparison with a case before the light beam is made to enter the diffraction grating GS. The two optical heterodyne signals obtained by the photoreceptor elements PD1 and PD2 are input to the phase difference detector PDC. The phase difference between the signals is detected by the detector PDC to measure the amount of movement of the diffraction grating GS.

If the grating constant of the diffraction grating GS is set at 1.6 $\mu$m and the amount of movement of diffraction grating GS is denoted as x, the following relation is satisfied:

$$8\delta = 8 \times \frac{2\pi x}{1.6} \text{ [rad]}$$

Therefore, when a phase deviation of one cycle, i.e., $8\delta = 2\pi$ [rad], is detected, it is clear that the diffraction grating GS is moved by 1.6 $\mu$m$\approx 8 = 0.2$ $\mu$m. Detection of an amount of movement with a high degree of resolution is made possible by making the minimum detection phase difference sufficiently smaller than one cycle. The use of the phase difference detector capable of resolving up to 0.2° permits a displacement to 0.11 [nm] to be measured theoretically.

Each of the above-described embodiments can be used for a speed measuring apparatus which measures speed as an amount of displacement per unit time. According to the above-described embodiments, a measuring apparatus having a higher degree of resolution than before can be used to detect optical displacement information.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the claims. The following claims are to be accorded a broad interpretation, so as to encompass all possible modifications and equivalent structures and functions.

What is claimed is:

1. A measuring method comprising the steps of:
   forming a first pair of beams and a second pair of beams, each of said first and second pairs of beams having a lower frequency light beam and a higher frequency light beam and each of the first and second pairs of beams being formed so that beat signals therefrom have the same frequency;
   changing a phase by causing the lower frequency light beam of said first pair of beams and the higher frequency light beam of said second pair of beams to pass through a predetermined optical path for causing phases thereof to be shifted in one direction so that information of a shifting phase of light is measured;
   forming a first beat signal of said first pair of beams using the lower frequency light beam of said first pair of beams which passed through said predetermined optical path;
   forming a second beat signal of said second pair of beam using the higher frequency light beam of said second pair of beams which passed through said predetermined optical path; and
   comparing said first beat signal with said second beat signal to measure the information of the shifting phase of light.

2. A measuring method according to claim 1, wherein said predetermined optical path is an optical path on a side of an interference system at which a length of an optical path of the interference system is detected, and the information of the shifting phase of light is measured as the change in the optical length of said side.

3. A measuring method according to claim 1, wherein the lower frequency light beam of said first pair of beams and the higher frequency light beam of said second pair of beams pass through a diffraction grating in said predetermined optical path, and the information of the shifting phase of light is measured as information on a position of said diffraction grating.

4. A measuring apparatus, comprising:
   beam forming means for forming a first pair of beams and a second pair of beams, each of said first and second pairs of beams having two light beams whose frequencies are different and each of said first and second pairs of beams being formed so that beat signals formed therefrom have the same frequency;
   optical means for causing a light beam of a lower frequency of said first pair of beams and a light beam of a higher frequency of said second pair of beams to pass through a predetermined optical path for shifting the phases thereof in one direction so that information of a shifting phase of light is measured;
   first detection means for detecting a first beat signal formed by said first pair of beams, said first beat signal being formed using the lower frequency light beam of said first pair of beams which passed through said predetermined optical path;
   second detection means for detecting a second beat signal formed by said second pair of beams, said second beat signal being formed using the higher frequency light beam of said second pair of beams which passed through said predetermined optical path; and
   measuring means for measuring the information of the shifting phase of light by comparing said first beat signal with said second beat signal.

5. A measuring apparatus according to claim 4, wherein said predetermined optical path is an optical path on a side at which a length of an optical path of an interference system is detected, and the information of the shifting phase of light is measured as information on the change in the optical path length of said side.

6. A measuring apparatus according to claim 4, wherein the lower frequency light beam of said first pair of beams and the higher frequency light beam of said second pair of beams pass through a diffraction grating in said predetermined optical path, said optical means causes the higher frequency light beam of said first pair of beams and the lower frequency light beam of said second pair of beams to pass through said diffraction grating through an optical path different from said predetermined optical path, and said measuring means measures the information of the shifting phase of light as information on a position of said diffraction grating.

7. An apparatus for measuring information on a displacement or a position of an object, comprising:

light source means for forming a first pair of beams and a second pairs of beams, each of said first and second pairs of beams having two light beams whose frequencies are different and each of said first and second pairs of beams being formed so that beat signals formed therefrom have the same frequency;

optical means for causing a light beam of a lower frequency of said first pair of beams and a light beam of a higher frequency of said second pair of beams to enter an object, as a result of which a change in phase being given to the lower frequency light beam of said first pair of beams and the higher frequency light beam of said second pair of beams is proportional to the displacement or the position of the object in one direction;

first photodetection means for detecting a first beat signal formed using the lower frequency light beam of said first pair of beams which passed through the object;

second photodetection means for detecting a second beat signal formed using the higher frequency light beam of said second pair of beams which passed through the object; and signal processing means for measuring information on the position or the displacement of said object by comparing said first beat signal with said second beat signal.

8. An apparatus according to claim 7, wherein said optical means has a Michelson interferometer that causes the lower frequency light beam of said first pair of beams and the higher frequency light beam of said second pair of beams to pass through a movable mirror as the object and causes a light beam of a higher frequency of said first pair of beams and a light beam of a lower frequency of said second pair of beams to pass through a reference-side mirror, and said signal processing means measures a displacement along the incidence of a light beam of said movable mirror.

9. An apparatus according to claim 7, wherein said optical means causes the lower frequency light beam of said first pair of beams and the higher frequency light beam of said second pair of beams to pass through a first diffraction grating as said object and to be diffracted at a positive order and causes the higher frequency light beam of said first pair of beams and the lower frequency light beam of said second pair of beams to pass through said first diffraction grating and to be diffracted at a negative order, and further comprising:

means for separating a part of said first and second pair of beams;

second optical means for causing a light beam of a lower frequency of said separated part of the first pair of beams and a light beam of a higher frequency of said separated part of the second pair of beams to pass through a second diffraction grating and to be diffracted at a positive order and causing a light beam of a higher frequency of said separated part of the first pair of beams and a light beam of a lower frequency of said separated part of the second pair of beams to pass through said second diffraction grating and to be diffracted at a negative order;

third photodetection means for detecting a third beat signal formed using said separated part of the first pair of beams which passed through said second diffraction grating; and fourth photodetection means for detecting a fourth beat signal formed using said separated part of the second pair of beams which passed through said second diffraction grating, wherein said signal processing means measures the grating arrangement orientation positional relation between said first and second diffraction gratings on the basis of outputs from said first to fourth photodetection means.

* * * * *

UNITED STATES PATENT AND TRADEMARK OFFICE
CERTIFICATE OF CORRECTION

PATENT NO. : 5,321,502
DATED : June 14, 1994
INVENTOR(S) : TAKAHIRO MATSUMOTO, ET AL.

It is certified that error appears in the above-identified patent and that said Letters Patent is hereby corrected as shown below:

ON TITLE PAGE

In [30] Foreign Application Priority Data, insert:
  --Jun. 2, 1992  [JP]  Japan .......... 4-141562--.

In [56] References Cited, under FOREIGN PATENT DOCUMENTS:
  "2297005  7/1990  Japan" should read
  --2-297005  12/1990  Japan--.

COLUMN 2

Line 47, "P (5)" should read
  -- P polarization are aligned by a polarization plate 314 similar to the polarization plate 305 and detected by a photoelectric detector 318. If $A_2$ and $B_2$ denote their respective amplitudes, $L_1$ denotes the optical path length of the light flux 315 from the beam splitter 304 to the photoelectric detector 318 after it is reflected by a mirror 310, $L_1 + 2\Delta L$ denotes the optical path length of the light flux 316 from the beam splitter 304 to the photoelectric detector 318 after it is reflected by the object 312 to be measured, complex amplitude displays $E_{1s}$ and $E_{2s}$ of respective light beams 316 and 315 in the photoelectric detector 318 can be expressed as follows:

$$E_{1s} = A_2 \cdot \exp[i\{(w_1 t + \phi_1 - k_1(L_s + L_1 + 2\Delta L))\}] \qquad (6)$$

$$E_{2s} = B_2 \cdot \exp[i\{(w_2 t + \phi_2 - k_2(L_s + L_1))\}] \qquad (7)$$

UNITED STATES PATENT AND TRADEMARK OFFICE
CERTIFICATE OF CORRECTION

PATENT NO. : 5,321,502

DATED : June 14, 1994

INVENTOR(S) : TAKAHIRO MATSUMOTO, ET AL.

It is certified that error appears in the above-identified patent and that said Letters Patent is hereby corrected as shown below:

COLUMN 2

Line 47 (con't),

The polarization directions of the signal light beam 315 and 316 are aligned by the polarization plate 314 to interfere with each other. A detection signal $I_s$ when the resulting interference light is detected by the photoelectric detector 318 is:

$$I_s = A^2_2 + B^2_2 + 2A_2 B_2 \cos\{(w_1-w_2)t + (\phi_1-\phi_2) + (k_2-k_1)(L_s+L_1) - 2k_1 \Delta L\} \quad (8)$$

This detection signal is a beat signal having a frequency of $w_1-w_2$, i.e., a frequency of $f_1-f_2$, and a phase of $\phi_s = (\phi_1-\phi_2)+(k_2-k_1)(L_s+L_1)-2k_1\Delta L$. The difference $\Delta(\phi_R-\phi_s)$ between the phases of the beat signals shown in equations (5)--.

Line 63, "$L_0-L_1=_{\Delta\phi0}/(k_2-k_1)$." should read --$L_0-L_1=\Delta\phi_0/(k_2-k_1)$.--.

COLUMN 3

Line 63, "polarization are aligned by a po-" should be deleted.
Lines 64-68 should be deleted.

COLUMN 4

Lines 1-24 should be deleted.
Line 25, "shown in equations" should be deleted.

UNITED STATES PATENT AND TRADEMARK OFFICE
CERTIFICATE OF CORRECTION

PATENT NO. : 5,321,502
DATED : June 14, 1994
INVENTOR(S) : TAKAHIRO MATSUMOTO, ET AL.

Page 3 of 5

It is certified that error appears in the above-identified patent and that said Letters Patent is hereby corrected as shown below:

COLUMN 6

Line 15, "$\Delta\phi_1$" should be deleted.

COLUMN 7

Equation (14), "$\phi_2 k_2$" should read --$\phi_2-k_2$--.

COLUMN 8

Line 13, "an" should read --a--.
Line 59, "25" should be deleted.

COLUMN 13

Line 34, "deviation Ax" should read --deviation $\Delta x$--.

COLUMN 14

Equation (42), "exp }i" should read --exp {i--.
Equation (43), "exp }i" should read --exp {i--.

COLUMN 15

Line 22, "(48)" should read --(52)--.
Line 24, "(49)" should read --(53)--.
Line 26, "(50)" should read --(54)--.
Line 28, "(51)" should read --(55)--.

COLUMN 16

Line 18, "$\phi_{2-1}$" should read --$\phi_2-\phi_1,$--.

UNITED STATES PATENT AND TRADEMARK OFFICE
CERTIFICATE OF CORRECTION

PATENT NO. : 5,321,502

DATED : June 14, 1994

INVENTOR(S) : TAKAHIRO MATSUMOTO, ET AL.

It is certified that error appears in the above-identified patent and that said Letters Patent is hereby corrected as shown below:

COLUMN 17

Line 61, "$u_{2B}(1)$" should read --$u_B(1)$--.

COLUMN 19

Line 68, "or order" should read --of orders--.

COLUMN 20

Equation (79), "$(\phi_2\phi_1)$" should read --$(\phi_2-\phi_1)$--.
Equation (80), "$(\phi_2\phi_1)$" should read --$(\phi_2-\phi_1)$--.

COLUMN 23

Line 57, "above.." should read --above.--.

COLUMN 24

Line 10, "frequency f1" should read --frequency $f_1$--.

COLUMN 26

Line 43, "frequency f1" should read --frequency $f_1$--.

COLUMN 27

Line 19, "$u_2=b$" should read --$u_2=b.$--.
Line 61, "phase $\delta$of" should read --phase $\delta$ of--.

UNITED STATES PATENT AND TRADEMARK OFFICE
CERTIFICATE OF CORRECTION

PATENT NO.  : 5,321,502
DATED       : June 14, 1994
INVENTOR(S) : TAKAHIRO MATSUMOTO, ET AL.

Page 5 of 5

It is certified that error appears in the above-identified patent and that said Letters Patent is hereby corrected as shown below:

<u>COLUMN 29</u>

Line 46, "a" should be deleted.

<u>COLUMN 30</u>

Line 43, "$f_2$each" should read --$f_2$ each--.

<u>COLUMN 32</u>

Line 15, "beam" should read --beams--.
   Line 18, "comparing" should read --¶ comparing--.

<u>COLUMN 33</u>

Line 16, "pairs" should read --pair--.

Signed and Sealed this

Seventh Day of March, 1995

Attest:

BRUCE LEHMAN

*Attesting Officer*

*Commissioner of Patents and Trademarks*